United States Patent [19]
Bishop et al.

[11] Patent Number: 6,114,797
[45] Date of Patent: Sep. 5, 2000

[54] IGNITION CIRCUIT WITH PIEZOELECTRIC TRANSFORMER

[75] Inventors: Richard Patten Bishop, Fairfax Station; Clark Davis Boyd, Hampton, both of Va.

[73] Assignee: Face International Corp., Norfolk, Va.

[21] Appl. No.: 09/436,516

[22] Filed: Nov. 9, 1999

Related U.S. Application Data

[63] Continuation-in-part of application No. 08/864,029, May 27, 1997, Pat. No. 5,834,882.
[60] Provisional application No. 60/107,625, Nov. 9, 1998.
[51] Int. Cl.[7] .................................................. H01L 41/107
[52] U.S. Cl. ............................................................ 310/318
[58] Field of Search ................................. 310/318, 316.01

[56] References Cited

U.S. PATENT DOCUMENTS

| | | |
|---|---|---|
| 3,690,309 | 9/1972 | Pluzhnikov et al. ............... 128/2 A |
| 5,329,200 | 7/1994 | Zaitsu ................................. 310/316.01 |
| 5,834,882 | 11/1998 | Bishop ................................. 310/359 |

*Primary Examiner*—Thomas M. Dougherty
*Attorney, Agent, or Firm*—Stephen E. Clark; David J. Bolduc

[57] ABSTRACT

Circuits for use in ignition systems are disclosed which use a resonating piezoelectric transformer along with complementary circuit components, to efficiently convert a DC first voltage to a transformer-output AC second voltage. In the preferred embodiment of the invention, a High Displacement Piezoelectric (HDP) transformer converts a DC voltage into an AC voltage which is rectified into a DC signal of sufficiently high voltage to create a spark across the spark gap of a spark plug. The transformer circuit may be a "self resonating" circuit which relies on an initial pulse from turning on the DC power supply to cause the transformer to begin resonating. In a modified circuit the circuit is not "self resonating" and instead has a phase shift oscillator sub-circuit that provides small pulse signals to start the transformer resonating when the circuit is initially turned on.

3 Claims, 10 Drawing Sheets

IGNITION CIRCUIT WITH PIEZOELECTRIC TRANSFORMER

This application claims priority from provisional application 60/107,625, filed Nov. 9, 1998, which is a continuation-in-part of U.S. application Ser. No. 08/864,029 filed May 2, 1997, now U.S. Pat. No. 5,834,882.

BACKGROUND OF THE INVENTION

1. Field of Invention

The present invention relates to piezoelectric transformers. More particularly, the present invention relates to a multi-layer piezoelectric transformer used in a circuit to generate a voltage sufficient to create a discharge across the spark gap, for example in an internal combustion engine of high intensity discharge lamp.

2. Description of the Prior Art

Wound-type electromagnetic transformers have been used for raising input voltages (step-up transformation) in internal power circuits of devices that require high voltage such as televisions, charging devices of copier machines or fluorescent lamp ballasts. Such electromagnetic transformers take the form of a conductor wound onto a core made of a magnetic substance. Because a large number of turns of the conductor are required to realize high transformation ratios, electromagnetic transformers that are effective, yet at the same time compact and slim in shape are extremely difficult to produce.

In particular, wound transformers have been used in the ignition systems of automobiles. The purpose of the ignition system is twofold: first to create a voltage high enough (20,000+) to arc across the gap of a spark plug, thus creating a spark strong enough to ignite the air/fuel mixture for combustion; second to control the timing so that the spark occurs at the right time and at the right cylinder.

The automotive ignition system includes designs from a mechanical system (distributor) to a solid state electronic system. The ignition circuit consists of two sub-circuits: the primary, which carries low voltage; and the secondary, which carries high voltage. The low voltage primary circuit will induce a high voltage in the secondary circuit through an ignition coil. The high voltage is then directed through the secondary circuit to the right spark plug at the right time.

The coil is a compact, electrical transformer that boosts the battery's 12 volts to as high as 20,000 volts. The incoming 12 volts of electricity pass through a primary winding which typically contains from 100 to 250 turns of heavy copper wire which raises the power to about 250 volts. The turns of this wire must be insulated from each other or they would short out and not create the primary magnetic field that is required. The primary circuit, controlled by the ignition key, releases 12 volts of electricity from the battery or alternator through the coil to a set of breaker points in the lower part of the distributor, or to the relay in electronic ignition applications. When the points or relay are closed, current flows through the chassis back to the battery, completing the circuit. When the points or relay are open, each interruption causing a breakdown in the coil's electromagnetic field. Each time the field collapses, a surge of electricity passes to a secondary winding. The coil secondary winding circuit typically contains from 15,000 to 30,000 turns of fine copper wire, which also must be insulated from each other. When the field collapses, the current is boosted to the high voltage needed for ignition and is then relayed to the rotor. To further increase the coil's magnetic field both windings are installed around a soft iron core. To withstand the heat of the current flow, the coil is filled with oil for cooling. As current flows through the coil a strong magnetic field is built up. When the current is shut off, the collapse of this magnetic field induces a high voltage which is released through the large center terminal of the ignition coil through the distributor to the spark plugs.

The secondary circuit consists of the secondary windings of the ignition coil, which produces the high voltage needed to arc across the spark plug gap. This voltage is sent out the center coil tower, through a high-tension (high voltage) wire to the distributor cap where a rotor distributes the spark through the distributor cap, to the right spark plug at the right time.

The distributor is separated into three sections: the upper, middle, and lower. In the middle section, the corners of the spinning breaker cam strike the breaker arm and separate the points. High-voltage surges generated by the action of the coil travel to the rotor that is rotating inside a circle of high-tension terminals in the distributor cap. At each terminal, current is transferred to wires that lead to the spark plugs. Two other devices—the vacuum advance and the centrifugal advance—precisely coordinate the functions of the points and the rotor assembly as the requirements of the engine vary.

Many older vehicles use a breaker point system to control the timing of the ignition system. Breaker points have not been used since the mid 70's, having been replaced by electronic ignition systems, but many older cars still have them. The points are made up of a fixed contact point and a movable contact point. The movable point is spring loaded and rides on a 4,6, or 8 lobe cam (depending on the number of cylinders). The points are located inside a distributor. As the engine rotates, the camshaft turns the distributor, which then opens and closes the breaker points as many as 15,000 to 25,000 times a minute. When the points are closed, current is allowed to flow through the ignition coil, thereby building a magnetic field around the windings. When the points are opened, they interrupt that current flow, thereby collapsing the magnetic field and releasing a high voltage surge. This high voltage enters the top of the distributor, where an ignition rotor distributes that voltage through a cap to the right spark plug at the right time. The distributor also contains a condenser that prevents arcing by absorbing excess current when the points open.

The difficulty with the breaker point system is that the part that rubs against the cam wears. This wear causes a constant need for adjustment and eventual replacement. In the mid 70's this problem was corrected through the use of solid state electronics and transistors as switching devices.

Electronic ignition systems also exist. Instead of having a wear-prone and super-sensitive mechanical switch control the flow of current to the primary winding of the coil, transistors were used. These semiconductor devices have the ability to switch a relatively large amount of amperage when they receive a very small control signal current, they are for all practical purposes capable of doing this at any speed, and they don't wear or erode.

The various breakerless electronic ignition system designs differ in the way the transistor control signal current is produced. The earliest was the magnetic pickup type, in which a reluctor or armature having as many teeth as there are cylinders in the engine rotates past a fixed magnet and pickup coil. As each tooth passes the pickup, it generates an electrical impulse (this is similar to an alternator without diodes). The transistor in the control module, also known as the igniter, switches the ignition coil's primary circuit on and off according to this impulse. It is still widely used on many makes today.

The Hall Effect type is also popular. The Hall principle states that if a constant current flows through a thin conducting material, and that material is exposed to a magnetic field, voltage will be generated, and the amount of voltage will depend on the strength of the field. In an ignition system, this phenomenon is put to work by the action of a shutter wheel in the distributor that interrupts the field created within the Hall generator by a permanent magnet (this is mounted across an air gap from a magnetically conducting element with a thin semiconductor layer). The wheel has as many shutters as there are cylinders, and they can be compared to the flat spots on a distributor cam. The ignition control unit is designed to supply current to the coil's primary winding while the shutter wheel is blocking the field. When the shutter moves out of the way and Hall voltage is produced, the control unit cuts off primary circuit current, the coil's field collapses, and induction produces high voltage in the secondary winding. There are other types too, such as optical triggers, but the magnetic pickup and Hall Effect varieties are the most common.

The 20,000 or more volts produced in the coil gets from the distributor cap to the spark plug through spark plug wires. Spark plug wires are made of various layers of materials. The fiber core, inside the spark plug wire carries the high voltage. Resistor spark plugs or special resistor type ignition cable may be used. To work effectively in modern ignition systems, it is important that the resistor ignition cable is capable of producing a specifically designed resistance. The cable must also have enough insulation so that it can withstand heat, cold, moisture, oil, grease, and chafing. High tension electricity passing through a cable builds up a surrounding electrical field. The electrical field frees oxygen in the surrounding air to form ozone, which will attach to the rubber insulation if it is not properly protected. Ozone causes the rubber to deteriorate and lose its insulating qualities. Electrical losses will seriously weaken the spark at the plug gap.

A problem with prior ignition systems is that magnetic coils require a large number of turns of wire to produce a high voltage, and therefore have a large size.

Another problem with prior ignition systems is because of the large size of magnetic coils, each spark plug could not have its own high voltage source.

Another problem with prior ignition systems is because of the large size of magnetic coils, a high voltage distribution system using high tension wires is necessary.

Another problem with prior ignition systems is because of the necessity for a high voltage distribution system, electrical and magnetic interference is generated.

Another problem with prior ignition systems is because of the necessity for a high voltage distribution system wires of specific resistance are necessary to minimize interference.

To remedy this problem, piezoelectric transformers utilizing the piezoelectric effect have been provided in the prior art. In contrast to the general electromagnetic transformer, the piezoelectric ceramic transformer has a number of advantages. The size of a piezoelectric transformer can be made smaller than electromagnetic transformers of comparable transformation ratio. Piezoelectric transformers can be made nonflammable, and they produce no electromagnetically induced noise.

The ceramic body employed in prior piezoelectric transformers takes various forms and configurations, including rings, flat slabs and the like. A typical example of a prior piezoelectric transformer is illustrated in FIG. 1. This type of piezoelectric transformer is commonly referred to as a "Rosen-type" piezoelectric transformer. The basic Rosen-type piezoelectric transformer was disclosed in U.S. Pat. No. 2,830,274 to Rosen, and numerous variations of this basic apparatus are well known in the prior art. The typical Rosen-type piezoelectric transformer comprises a flat ceramic slab 110 which is appreciably longer than it is wide and substantially wider than thick. As shown in FIG. 1, a piezoelectric body 110 is employed having some portions polarized differently from others. In the case of the prior transformer illustrated in FIG. 1, the piezoelectric body 110 is in the form of a flat slab which is considerably wider than it is thick, and having greater length than width. A substantial portion of the slab 110 the portion 112 to the right of the center of the slab, is polarized longitudinally, whereas the remainder of the slab is polarized transversely to the plane of the face of the slab. In this case the remainder of the slab is actually divided into two portions, one portion 114 being polarized transversely in one direction, and the remainder of the left half of the slab, the portion 116 also being polarized transversely but in the direction opposite to the direction of polarization in the portion 114.

In order that electrical voltages may be related to mechanical stress in the slab 110, electrodes are provided. If desired, there may be a common electrode 118, shown as grounded. For the primary connection and for relating voltage at opposite faces of the transversely polarized portion 114 of the slab 110, there is an electrode 120 opposite the common electrode 118. For relating voltages to stress generated in the longitudinal direction of the slab 110, there is a secondary or high-voltage electrode 122 cooperating with the common electrode 118. The electrode 122 is shown as connected to a terminal 124 of an output load 126 grounded at its opposite end.

In the arrangement illustrated in FIG. 1, a voltage applied between the electrodes 118 and 120 is stepped up to a high voltage between the electrodes 118 and 122 for supplying the load 126 at a much higher voltage than that applied between the electrodes 118 and 120.

An inherent problem of such prior piezoelectric transformers that they have relatively low power transmission capacity. This disadvantage of prior piezoelectric transformers relates to the fact that little or no mechanical advantage is realized between the driver portion of the device and the driven portion of the device, since each is intrinsically a portion of the same electroactive member. This inherently restricts the mechanical energy transmission capability of the device, which, in turn, inherently restricts the electrical power handling capacity of such devices. Additionally, because the piezoelectric voltage transmission function of Rosen-type piezoelectric transformers is accomplished by proportionate changes in the x-y and y-z surface areas (or, in certain embodiments, changes in the x-y and x'-y' surface areas) of the piezoelectric member, which changes are of relatively low magnitude, the power handling capacity of prior circuits using such piezoelectric transformers is inherently low.

Because the typical prior piezoelectric transformer accomplishes the piezoelectric voltage transmission function by proportionate changes in the x-y and y-z surface areas (or, in certain embodiments, changes in the x-y and x'-y' surface areas) of the piezoelectric member, it is generally necessary to alternatingly apply positive and negative voltages across opposing faces of the "driver" portion of the member in order to "push" and "pull", respectively, the member into the desired shape. Prior electrical circuits which incorporate such prior piezoelectric transformers are relatively inefficient because the energy required during the first half-cycle of operation to "push" the piezoelectric member into a first shape is largely lost (i.e. by generating heat) during the "pull" half-cycle of operation. This heat generation corresponds to a lowering of efficiency of the circuit, an increased fire hazard, and/or a reduction in component and circuit reliability. Furthermore, in order to reduce the temperature of such heat generating circuits, the circuit components (typically including switching transistors and other components, as well as the transformer itself) are oversized, which reduces the number of applications in which the circuit can be utilized, and which also increases the cost/price of the circuit.

Another problem with prior piezoelectric transformers is, because the power transmission capacity of such prior piezoelectric transformers is low, it is necessary to combine several such transformers together into a multi-layer "stack" in order to achieve a greater power transmission capacity than would be achievable using one such prior transformer alone. This, of course, increases both the size and the manufacturing cost of the transformer; and the resulting power handling capacity of the "stack" is still limited to the arithmetic sum of the power handling capacity of the individual elements.

Accordingly, it would be desirable to provide a piezoelectric transformer design that has a higher power transmission capacity than similarly sized prior piezoelectric transformers.

It would also be desirable to provide a piezoelectric transformer that can generate a voltage sufficient to generate a spark across a spark plug gap in an ignition system.

It would also be desirable to provide a piezoelectric transformer that is smaller than prior piezoelectric transformers that have similar power transmission capacities.

It would also be desirable to provide a piezoelectric transformer in which the "driver" portion of the device and the "driven" portion of the device are not the same electroactive element.

It would also be desirable to provide a piezoelectric transformer that develops a substantial mechanical advantage between the driver portion of the device and the driven portion of the device.

It would also be desirable to provide a piezoelectric transformer that, at its natural frequency, oscillates with greater momentum than is achievable in comparably sized prior piezoelectric transformers.

A problem with prior piezoelectric transformers is that they are difficult to manufacture because individual ceramic elements must be polarized at least twice each, and the directions of the polarization must be along different axes.

Another problem with prior piezoelectric transformers is that they are difficult to manufacture because it is necessary to apply electrodes not only to the major faces of the ceramic element, but also to at least one of the minor faces of the ceramic element.

Another problem with prior piezoelectric transformers is that they are difficult to manufacture because, in order to electrically connect the transformer to an electric circuit, it is necessary to attach (i.e. by soldering or otherwise) electrical conductors (e.g. wires) to electrodes on the major faces of the ceramic element as well as on at least one minor face of the ceramic element.

Another problem with prior piezoelectric transformers is that the voltage output of the device is limited by the ability of the ceramic element to undergo deformation without cracking or structurally failing. It is therefore desirable to provide a piezoelectric transformer which is adapted to deform under high voltage conditions without damaging the ceramic element of the device.

It is another problem of prior piezoelectric transformers that they tend to break down (i.e. short) under relatively low voltages.

It is another problem with prior transformers that they have low power utilization efficiencies, such as magnetic transformers which have an efficiency loss of up to 40–50%.

Another problem with prior transformers is that the magnetic core and coiled wire can generate magnetic fields that interfere with surrounding circuitry.

Another problem with prior transformers is that they are difficult to miniaturize to the extent that they could be attached to a spark plug.

SUMMARY OF THE INVENTION

The term piezoelectric transformer is here applied to an energy-transfer device employing the piezoelectric properties of two co-joined materials to achieve the transformation of voltage or current or impedance. It is a primary object of the present invention to provide an ignition system circuit including a piezoelectric transformer to generate the voltage for creating a discharge across a spark gap. According to the present invention, there is provided an electric circuit that incorporates a piezoelectric transformer preferably operating at its natural (i.e. "resonant") frequency to convert a transformer input signal of a first character (i.e. voltage, frequency and current) to a transformer output signal of a second character (i.e. voltage, frequency and current). The disclosed circuit, efficiently accomplishes the described signal conversion by subjecting the "driver" section of a piezoelectric transformer to a voltage of a first polarity, which in turn causes the piezoelectric transformer to deform, which in turn causes the "driven" section of the piezoelectric transformer to deform, and which in turn generates an output voltage at the driven section of the transformer. During steady state operation of the circuit, electrical energy applied to the driver section of the transformer is either (1) piezoelectrically converted to electrical energy at the output side of the transformer, (2) dissipated as heat by the transformer, or (3) stored as mechanical energy by the transformer. In the present invention, a circuit is provided in which the portion of energy that is stored as mechanical energy by the transformer during one half-cycle of operation of the circuit is nearly entirely converted back into useable electrical energy (at a voltage of an opposite polarity) during the second half-cycle of operation of the circuit. Thus a resonant circuit is provided, together with preferably a single switching transistor, for oscillating the piezoelectric transformer at its resonant frequency while minimizing energy losses (i.e. heat dissipation) in the ignition circuit.

In a preferred embodiment of the invention, which comprises a multi-layer piezoelectric transformer that is capable of achieving high mechanical momentum (and, therefore, is capable of high energy storage and transmission), a circuit is provided to generate discharge across the spark gap of an ignition system.

Accordingly, it is an object the present invention to provide a piezoelectric transformer design that has a higher power transmission capacity than similarly sized prior piezoelectric transformers.

It is another object of the present invention to provide a piezoelectric transformer that is smaller than prior piezoelectric transformers that have similar power transmission capacities.

It is another object of the present invention to provide a piezoelectric transformer in which the "driver" portion of the device and the "driven" portion of the device are not the same electro-active element.

It is another object of the present invention to provide a piezoelectric transformer that develops a substantial mechanical advantage between the driver portion of the device and the driven portion of the device.

It is another object of the present invention to provide a piezoelectric transformer that, at its natural frequency, oscillates with greater momentum than is achievable in comparably sized prior piezoelectric transformers.

It is another object of the present invention to provide an ignition circuit that is highly efficient, that uses fewer circuit components than prior ignition circuits that perform comparable signal transformation functions, and that is relatively less expensive to manufacture than prior ignition circuits that perform comparable signal transformation functions.

It is another object of the present invention to provide a solid state ignition circuit that has high power transmission capabilities.

It is an object to provide a modification of an ignition circuit of the character described in which the transformer output portion of the circuit is electrically isolated from the transformer input portion of the circuit.

It is another object of the present invention to provide a piezoelectric transformer comprising a pair of ceramic elements, each exhibiting piezoelectric properties, which are in physical (mechanical) communication with each other such that deformation of one ceramic element in a plane results in corresponding deformation of the other ceramic element in the same plane.

It is another object of the present invention to provide a piezoelectric transformer of the character described in which two piezoceramic elements, each having a pair of opposing major surfaces, are mechanically bonded together with a major surface of one of the piezoceramic elements facing a major surface of the other piezoceramic element along an interface plane.

It is another object of the present invention to provide a piezoelectric transformer of the character described in which the two elements are joined such that when a first voltage is applied across the major surfaces of the first of piezoceramic element, the first piezoceramic element deforms in a direction parallel to the interface plane.

It is another object of the present invention to provide a piezoelectric transformer of the character described in which such a deformation of the first piezoceramic element causes a corresponding deformation of the second piezoceramic element in the same direction (i.e. parallel to the interface plane).

It is another object of the present invention to provide a piezoelectric transformer of the character described in which such a deformation of the second piezoceramic element produces a second voltage across the opposing major surfaces of the second piezoceramic element.

It is another object of the present invention to provide a piezoelectric transformer of the character described in which the second voltage produced across the opposing major surfaces of the second piezoceramic element is sufficient to create a spark across a spark gap in an ignition system.

It is another object of the present invention to provide a piezoelectric transformer of the character described which may be easily and inexpensively produced.

It is another object of the present invention to provide a piezoelectric transformer of the character described which is easy to manufacture because it is sufficient to polarize each ceramic element only once and in only one direction.

It is another object of the present invention to provide a piezoelectric transformer of the character described which is easy to manufacture and miniaturize, for example by using Micro Electronic Machining Systems (MEMS)

It is another object of the present invention to provide a piezoelectric transformer of the character described which is easy to connect or install in an electric circuit, because it is sufficient to attach (i.e. by soldering or otherwise) electrical conductors (e.g. wires) only to electrodes on the major faces of the ceramic element.

It is another object of the present invention to provide a piezoelectric transformer of the character described in an electric circuit which can be connected directly to a spark plug.

It is another object of the present invention to provide a piezoelectric transformer of the character described which electrically isolates the voltage and current at the input to the device from the voltage and current at the output of the device under high voltage input conditions without degrading the isolation properties of the transformer.

It is another object of the present invention to provide, in an internal combustion engine ignition system, a circuit including a transformer of the character described which is operable throughout a broad thermal range.

It is another object of the present invention to provide, in an internal combustion engine ignition system, a circuit including a transformer of the character described which provides secondary high voltage to a spark plug.

It is another object of the present invention to provide, in an internal combustion engine ignition system, a circuit including a transformer of the character described which provides secondary high voltage directly to a spark plug without the use of high tension electrical distribution wires.

It is another object of the present invention to provide, in an internal combustion engine ignition system, a circuit including a transformer of the character described which is small enough to be attached directly to a spark plug or to a primary low voltage electrical distribution wire.

Further objects and advantages of my invention will become apparent from a consideration of the drawings and ensuing description thereof.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DESCRIPTION OF THE PREFERRED EMBODIMENT

Figure 1:
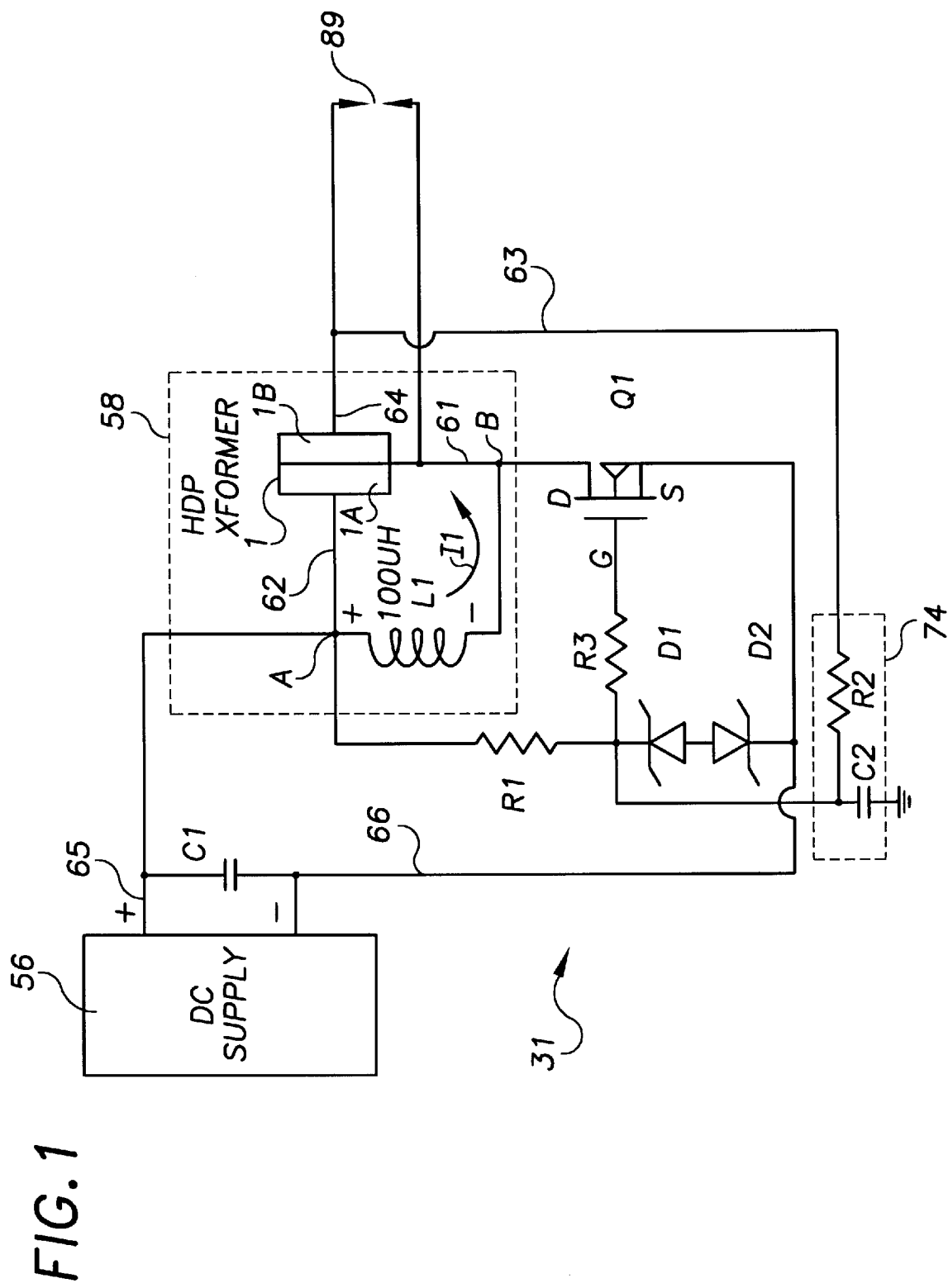
FIG. 1 a schematic diagram of one exemplary embodiment of a voltage converter/ignition circuit that incorporates principles of the present invention.

As will be described more fully herein below, according to the preferred embodiment of the present invention, there is provided an electric circuit that incorporates a piezoelectric transformer 1 operating at its natural (i.e. "resonant") frequency to convert a transformer input signal 62 of a first character (i.e. voltage, frequency and current) to a transformer output signal 64 of a second character (i.e. voltage, frequency and current). The described circuit, which is powered by a DC source 56 (i.e., 12 Volt car battery), efficiently accomplishes the described signal conversion by subjecting the driver (or, "input") section 1A of the piezoelectric transformer to a voltage of a first polarity, which in turn causes the piezoelectric transformer 1 to deform, which in turn causes the driven (or, "output") section 1B of the piezoelectric transformer to deform, and which, in turn, generates an output voltage at the driven section 1B of the transformer. During steady state operation of the circuit, electrical energy applied to the driver section 1A of the transformer is (a) piezoelectrically converted to electrical energy at the output side of the transformer, (b) dissipated as heat by the transformer, and/or (c) stored as mechanical energy by the transformer 1. In the present invention, a circuit is provided in which the portion of energy that is stored as mechanical energy by the transformer 1 during one half-cycle of operation of the circuit, is nearly entirely converted back into useable electrical energy (at a voltage of an opposite polarity) during the second half-cycle of operation of the circuit, thus providing an exceptionally efficient voltage transformer circuit. As will be more fully described herein below, and as illustrated in FIG. 1, a parallel resonant circuit 58 is provided, together with preferably a single switching transistor Q1, for oscillating the piezoelectric transformer 1 at its resonant frequency while minimizing energy losses in the voltage converter circuit.

In a preferred embodiment of the invention, which comprises a multi-layer piezoelectric transformer 1 that is capable of achieving high mechanical momentum (and, therefore, is capable of high energy storage and transmission), a circuit provides the high voltage necessary to initiate a discharge across the spark gap in an ignition system. It will be understood from the instant disclosure that a circuit constructed and operated in accordance with the principles of the present invention can be most advantageously practiced by using a multi-layer piezoelectric transformer 1 that is capable of achieving high mechanical momentum (and, therefore, is capable of high energy storage and transmission). Accordingly, a description of the construction and characteristics of the preferred high performance multi-layer piezoelectric transformer is given below. However, it should be understood that other, conventional, piezoelectric transformers may be used in modified embodiments of the invention to advantageously optimize the operational (i.e. voltage conversion and power transmission) performance of such conventional transformers.

An application of the preferred embodiment of the invention is described below wherein the voltage converter circuit is used to create a spark across the spark gap of an ignition circuit, particularly for an internal combustion engine. However, it should be understood that the voltage conversion portion of the circuit of the present invention may be advantageously used for many applications, and the scope of the invention, therefore, should not be limited by the nature or description of the "load" that may be applied to the transformer's output.

High Deformation Piezoelectric Transformer

Figure 7:
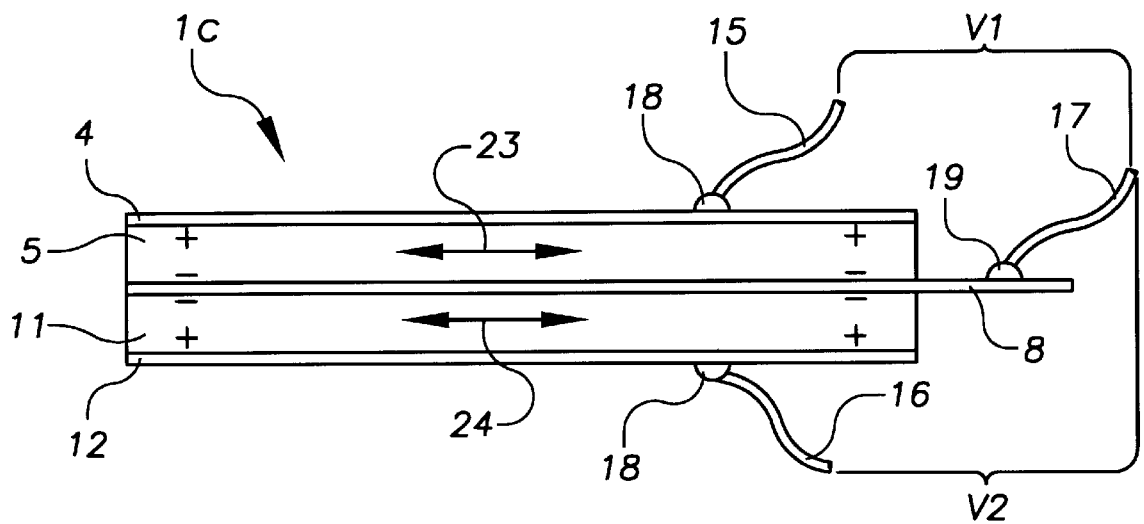
FIG. 7 is an elevation view showing a modified multi-layer piezoelectric transformer that may be used in a voltage converter/ignition circuit constructed in accordance with the principles of the present invention.

Referring to FIG. 7: A high deformation piezoelectric (HDP) transformer 1C comprises a first piezoelectric ceramic layer 5 and a second piezoelectric ceramic layer 11. First and second piezoelectric ceramic layers 5 and 11 comprise discrete members bonded to a substantially flat intermediate electrode 8. The composite structure has a longitudinal plane that is substantially parallel to the planes of interface between the intermediate electrode 8 and first and second ceramic layers 5 and 11. Opposite outboard surfaces of ceramic layers 5 and 11 are electroded 4 and 12, respectively, such as by electro-depositing or the like. Electrodes 4 and 12 substantially extend over the entire outboard opposing surfaces of ceramic layers 5 and 11. The ceramic layers 5 and 11 are each electrically polarized (substantially throughout their respective masses) in the same direction, namely perpendicular to the longitudinal plane of the composite structure. In other words, ceramic layer 5 is polarized between electrode 4 and electrode 8 such that when a first voltage V1 of a first polarity is applied between electrode 4 and electrode 8, ceramic layer 5 tends to elongate (as indicated by arrow 23) in a direction parallel to the longitudinal plane of the composite structure; and when a voltage V1 of a second first polarity is applied between electrode 4 and electrode 8, ceramic layer 5 tends to contract in a direction parallel to the longitudinal plane of the composite structure. Similarly, ceramic layer 11 is polarized between electrode 12 and electrode 8 such that when a second voltage V2 of a first polarity is applied between electrode 12 and electrode 8, ceramic layer 11 tends to elongate (as indicated by arrow 24) in a direction parallel to the longitudinal plane of the composite structure; and when a voltage V2 of a second first polarity is applied between electrode 12 and electrode 8, ceramic layer 11 tends to contract in a direction parallel to the longitudinal plane of the composite structure. As stated above, the direction electrical polarization of the ceramic layers 5 and 11 are parallel to each other (i.e. perpendicular to the longitudinal plane of the composite structure). It is preferable that polarization is oriented such that outboard-facing surfaces of the ceramic layers 5 and 11 are "positively" poled, while the facing interior surfaces of the ceramic layer 5 and 11 are negatively poled (as indicated by "+" and "−" signs, respectively, in FIG. 7).

As will be explained more fully herein below, in the preferred operation of the present invention one ceramic layer (e.g. 5) serves as a "driver" section that may longitudinally extend or contract upon application (across electrodes 4 and 8) of a first voltage, and the other ceramic layer (e.g. 11) serves as a "driven" section that that may piezoelectrically generate a second voltage (across electrodes 8 and 12) when physically strained in a direction parallel the longitudinal plane of the composite structure.

Because ceramic layers 5 and 11 are constructed of piezoelectric materials, preferably PZT, that are transversely polarized, when a voltage V1 (of a first polarity) is applied across electrodes 4 and 8, ceramic layer 5 tends to piezoelectrically elongate as indicated by arrows 23 in a direction substantially parallel to the longitudinal plane of the composite structure. This elongation (23) of ceramic layer 5 is translated to ceramic layer I1, which begin to elongate in a like direction. This initially longitudinal elongation of ceramic layer 11 results in the piezoelectric generation of a second voltage V2 between electrodes 12 and 8. Similarly, when the polarity of the voltage V1 across electrodes 4 and 8 is reversed, a second voltage V2 of reverse polarity is developed between electrodes 12 and 8.

Figure 3:
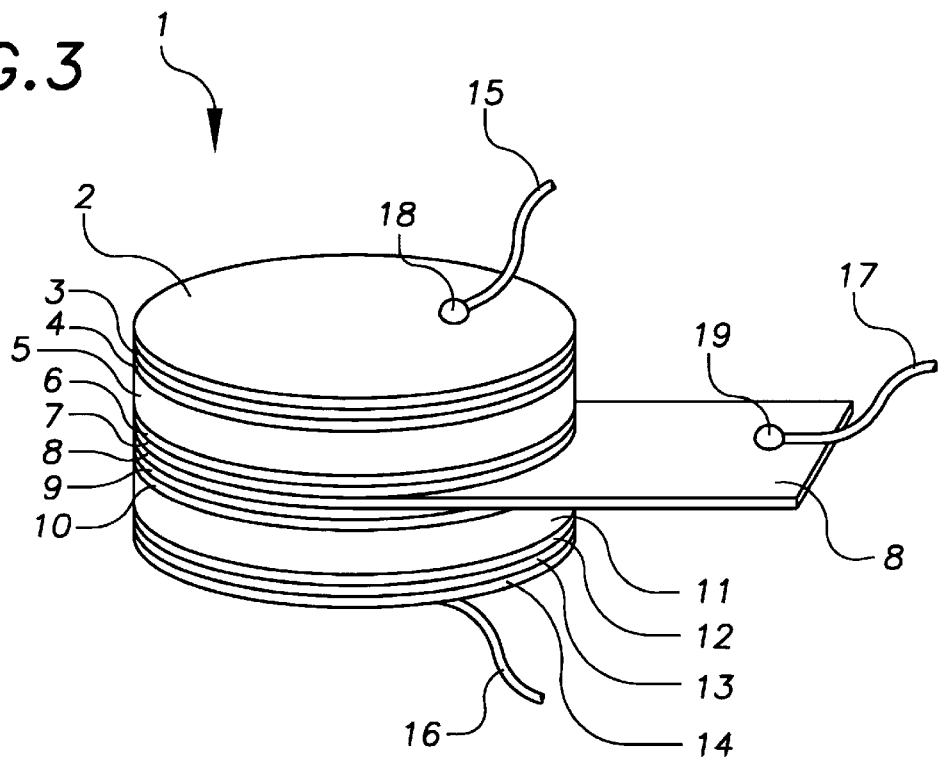
FIG. 3 is a perspective view of a multi-layer piezoelectric transformer that is preferably used in a voltage converter/ignition circuit constructed in accordance with the principles of the present invention.
Figure 4:
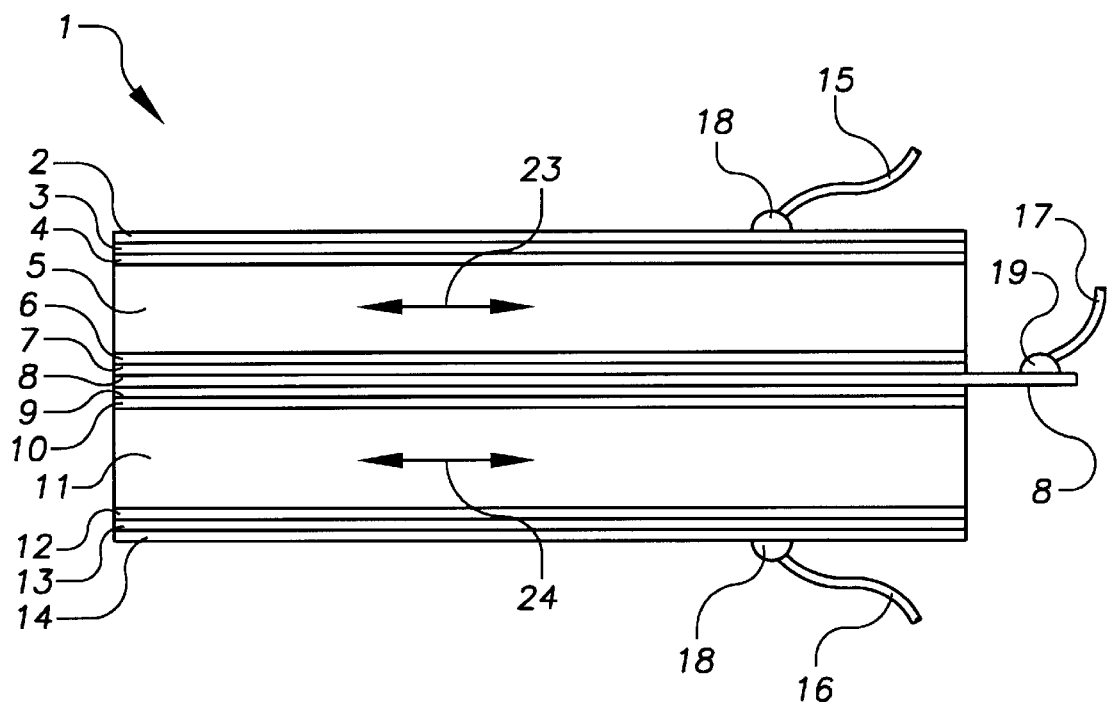
FIG. 4 is an elevation view showing the details of construction of the multi-layer piezoelectric transformer shown in FIG. 3.
Figure 5:
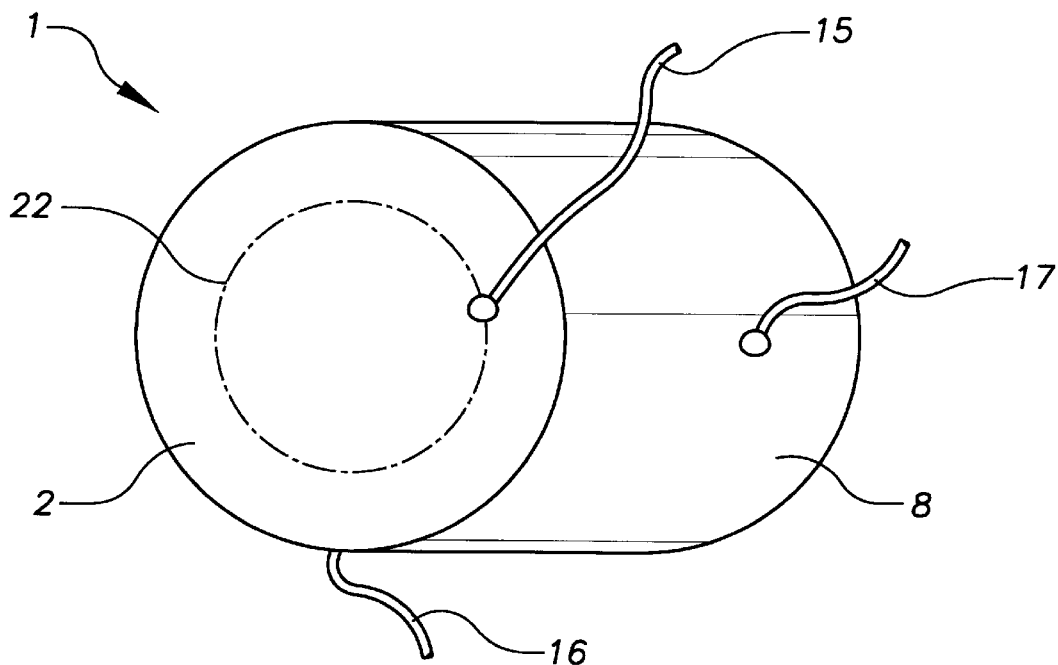
FIG. 5 is a is a plan view showing the top of the multi-layer piezoelectric transformer shown in FIG. 3.

Referring now to FIGS. 3–5: In the preferred embodiment of the invention, the HDP transformer 1 comprises a first piezoelectric ceramic layer 5 and a second piezoelectric ceramic layer 11. First and second piezoelectric ceramic layers 5 and 11 preferably comprise discrete members having electrodes 4 and 6, and 10 and 12, respectively, electro-deposited to their two opposing major faces. An adhesive 3, 7, 9 and 13, such as "Cibageigy AV118" as manufactured by Ciba Specialty Chemicals Corporation, N.A. of East Lansing, Mich. is used to bond a first exterior electrode 2 to electrode 4, an intermediate electrode 8 to first interior electrode 6, intermediate electrode 8 to a second interior electrode 10, and second exterior electrode 14 to electrode 12, respectively.

The composite structure (1) has a longitudinal plane that is substantially parallel to the planes of interface between the intermediate electrode 8 and first and second ceramic layers 5 and 11. Electrodes 4, 6, 9 and 12 substantially extend over the respective opposing surfaces of ceramic layers 5 and 11. The ceramic layers 5 and 11 are each electrically polarized (substantially throughout their respective masses) in the same direction, namely perpendicular to the longitudinal plane of the composite structure (1). In other words, ceramic layer 5 is polarized between electrode 4 and electrode 6 such that when a first voltage of a first polarity is applied between electrode 4 and electrode 6, ceramic layer 5 tends to elongate (as indicated by arrow 23) in a direction parallel to the longitudinal plane of the composite structure; and when a first voltage of a second polarity is applied between electrode 4 and electrode 6, ceramic layer 5 tends to contract in a direction parallel to the longitudinal plane of the composite structure. Similarly, ceramic layer 11 is polarized between electrode 12 and electrode 10 such that when a second voltage of a first polarity is applied between electrode 12 and electrode 10, ceramic layer 11 tends to elongate (as indicated by arrow 24) in a direction parallel to the longitudinal plane of the composite structure; and when a voltage of a second first polarity is applied between electrode 12 and electrode 10, ceramic layer 11 tends to contract in a direction parallel to the longitudinal plane of the composite structure. As will become apparent from the following disclosure, the above description of the polarization characteristics of the ceramic layers 5 and 11 is useful to illustrate that the two ceramic layers 5 and 11 are similarly polarized substantially across their entire cross-sections and that the lines of polarization of each ceramic layer 5 and 11 are parallel (i.e. perpendicular to the longitudinal plane of the composite structure). However, as will be explained more fully herein below, in the preferred operation of the present invention voltage is not actually applied to the second ceramic layer (i.e. ceramic layer 11) to cause it to deform; rather it is mechanically deformed (i.e. by ceramic layer 5) and thus piezoelectrically generates a voltage potential across it opposing electrodes 10 and 12. Thus, in the preferred embodiment of the invention one ceramic layer (i.e. 5) serves as a "driver" section that may longitudinally extend or contract upon application (across electrodes 4 and 8) of a first voltage, and the other ceramic layer (e.g. 11) serves as a "driven" section that that may piezoelectrically generate a second voltage (across electrodes 8 and 12) when physically strained in a direction parallel the longitudinal plane of the composite structure.

Because ceramic layers 5 and 11 are constructed of piezoelectric materials, preferably PZT, that are transversely polarized (i.e. perpendicular to the longitudinal plane of the composite structure), when a voltage (of a first polarity) is applied across electrodes 4 and 6, ceramic layer 5 tends to piezoelectrically elongate as indicated by arrows 23 in a direction substantially parallel to the longitudinal plane of the composite structure. This elongation (23) of ceramic layer 5 is translated to ceramic layer 11, which begins to elongate in a like direction. This initially longitudinal elongation of ceramic layer 11 results in the piezoelectric generation of a second voltage between electrodes 12 and 10. Similarly, when the polarity of the voltage across electrodes 4 and 8 is reversed, a second voltage of reverse polarity is developed between electrodes 12 and 8.

In the preferred embodiment of the invention the HDP transformer 1 is circular as viewed from above (as shown in FIG. 5) and of rectangular cross-section (as shown in FIG. 4). A circular shape of the HDP transformer 1 is desirable in step-up, narrow bandwidth transformer applications because its symmetry reduces the introduction of interfering secondary and harmonic vibrations in the device. Asymmetric (i.e. non-circular, irregularly-shaped) geometry for the HDP transformer is desirable in broad bandwidth transformer applications because its asymmetry causes secondary and harmonic vibrations that reduce resonant frequency spikes.

Figure 6:
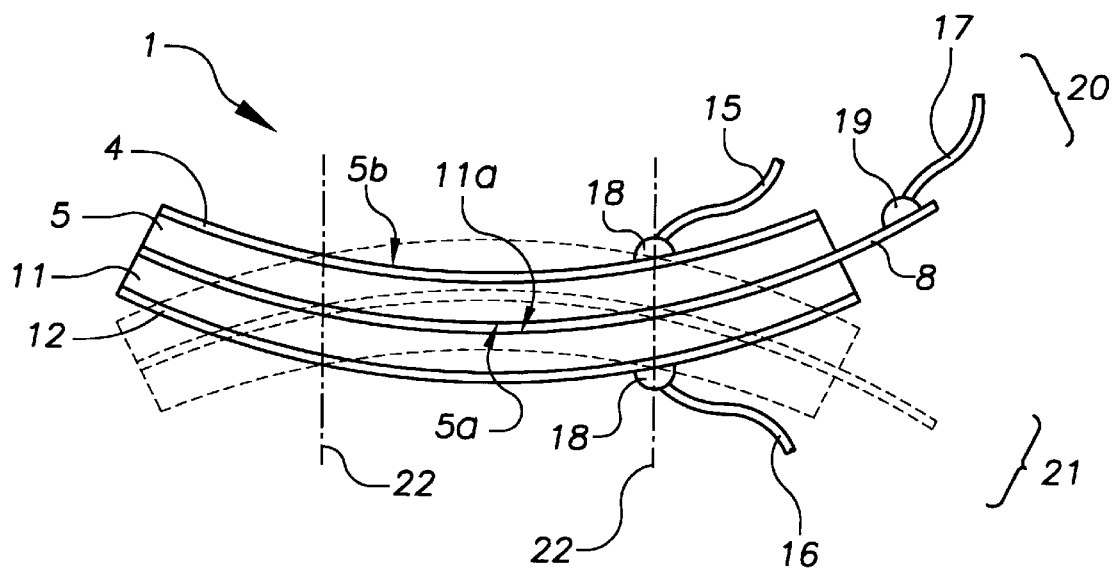
FIG. 6 is a schematic side view showing the flexing that the multi-layer piezoelectric transformer of FIG. 3 undergoes upon the application of voltages of opposite polarity.

Referring now to FIG. 6: FIG. 6 is a schematic side view showing the flexing that the HDP transformer 1 undergoes upon the application of a voltage. FIG. 6 schematically illustrates a HDP transformer 1 having first and second piezoelectric ceramic layers 5 and 11 bonded along a longitudinal plane to an intermediate electrode 8. Electrodes 4 and 12 are disposed on the outboard opposing surfaces of ceramic layers 5 and 11, respectively. Ceramic layers 5 and 11 are electrically polarized in the manner described above.

When a voltage of a first polarity is applied between exterior electrode 4 and interior electrode 8, ceramic layer 5 begins to elongate in a direction substantially parallel to the longitudinal plane of the composite structure 1. In the case where ceramic layer 5 comprises a substantially flat disc, such application of a voltage of a first polarity will be understood to cause to ceramic layer 5 to tend to radially expand. Such radial expansion of ceramic layer 5 is opposed by ceramic layer 11, to which it is (indirectly) bonded at 8 their respective interior surfaces 5a and 11a. Such radial expansion of ceramic layer 5 causes tensile stress at the interior surface 11a of ceramic layer 11. This tensile stress at the interior surface 11a of ceramic layer 11 develops a moment in ceramic layer 11, which, in turn, causes ceramic layer 11 to curve as indicated by dashed lines (position 21) in FIG. 6. In addition, because the radial expansion of the interior surface 5a of the first ceramic is resisted by the compressive force of ceramic layer 11, while the radial expansion of the exterior surface 5b of ceramic layer 5 is not subjected to such a force, ceramic layer 5 tends further to curve as indicated by dashed lines (position 21) in FIG. 6.

When the frequency of the voltage applied between electrodes 4 and 8 is selected to match (or substantially match) the natural frequency of the HDP transformer 1, the composite structure will vibrate as illustrated in FIG. 6 (from position 20 to position 21). The HDP tends to resonate in such a manner to establish nodes as indicated at lines 22 in FIG. 6. If the shape of the HDP transformer were circular, as in the preferred embodiment of the invention, the node 22 would be established in a circular pattern in plan view, as illustrated in FIG. 5. Because the node 22 represents the position of minimum displacement of the vibrating HDP transformer 1, electrical leads 15 and 16 are preferably attached (for example by solder or conductive epoxy 18, or the like) at the node 22.

In the preferred embodiment of the invention the ceramic layer 5 on the "driver" side 1A of the transformer 1 is made of a "hard" ceramic material. "Hard" ceramics are desirable because they can withstand high levels of electrical excitation and mechanical stress and typically have high Q factors. Examples of "hard" ceramic materials include, but are not limited to: PZT-4 (DOD Type I) and PZT-8 (DOD Type III) as manufactured by Morgan Matroc Company; or APC-841 as manufactured by American Piezo Ceramics, Inc. By way of example, APC 841 has the following characteristics: 0.35% dissipation factor measured at C1 KC @ Low Field; 320 degree C. Curie Temperature; 0.033 to 0.067 coupling coefficient; 109 m/V to $450 \times 10^{-12}$ m/V piezoelectric coefficient; 10.5 to $35 \times 10^{-3}$ $m^2/C$ piezoelectric coefficient; 6.3 to $7.6 \times 10^{10}$ $N/m^2$ Young's Modulus; 2070 m/s longitudinal mode frequency constant; 1710 m/s thickness mode frequency constant; 2260 radial mode frequency constant; 11.7 to $17.3 \times 10^{12}$ $m^2/N$ elastic compliance; 7.6 g/cc density; and 1400 mechanical quality ("$Q_m$") factor.

In the preferred embodiment of the invention the ceramic layer 11 on the "driven" side 1B of the transformer 1 is made of a "soft" ceramic material. A "soft" ceramic is desirable on the driven side 1B of the transformer 1 because it offers relatively less resistance to being mechanically deformed than would a "hard" ceramic material. Examples of "soft" ceramic materials include, but are not limited to: PZT-5A (DOD Type II) and PZT-5B (DOD Type III) as manufactured by Morgan Matroc Company; or APC-850 as manufactured by American Piezo Ceramics, Inc. By way of example, APC 850 has the following characteristics: 1.4% dissipation factor measured at C1 KC @ Low Field; 360 degree C. Curie Temperature; 0.036 to 0.072 coupling coefficient; 175 m/V to $590 \times 10^{12}$ m/V piezoelectric coefficient; 12.4 to $36 \times 10^{-3}$ $m^2/C$ piezoelectric coefficient; 5.4 to $6.3 \times 10^{10}$ $N/m^2$ Young's Modulus; 1900 m/s longitudinal mode frequency constant; 1530 m/s thickness mode frequency constant; 2030 radial mode frequency constant; 15.3 to $17.3 \times 10^{12}$ $m^2/N$ elastic compliance; 7.7 g/cc density; and 80 mechanical quality ("$Q_m$") factor.

It has been observed that when the HDP transformer 1 is electrically actuated as described above, causing "lamb" wave resonant frequency vibration of the composite device, it is possible to achieve deformation of ceramic layers 5 and 11 one or more orders of magnitude greater than would be possible by surface wave or planar piezoelectric deformation (such as typically may occur in prior "Rosen-type" piezoelectric transformers). When an input voltage across ceramic layer 5 causes ceramic layer 5 to piezoelectrically deform, it, in turn, mechanically causes ceramic layer 11 to deform, and such mechanically induced deformation of ceramic layer 11 piezoelectrically generates a second voltage across the electrodes 8 and 12 of ceramic layer 11. Because the achievable deformation is one or more orders of magnitude greater than is possible in prior Rosen-type transformers, the power transmission capacity of the described HDP transformer 1 is similarly one or more orders of magnitude greater than is possible in prior Rosen-type transformers of a similar size.

Below are described methods of using the HDP transformer 1 in an ignition circuit, particularly in an internal combustion engine application. In order to understand the operation of the HDP transformer in such applications, the performance characteristics of the disclosed HDP transformer 1 are first described.

Figure 8:
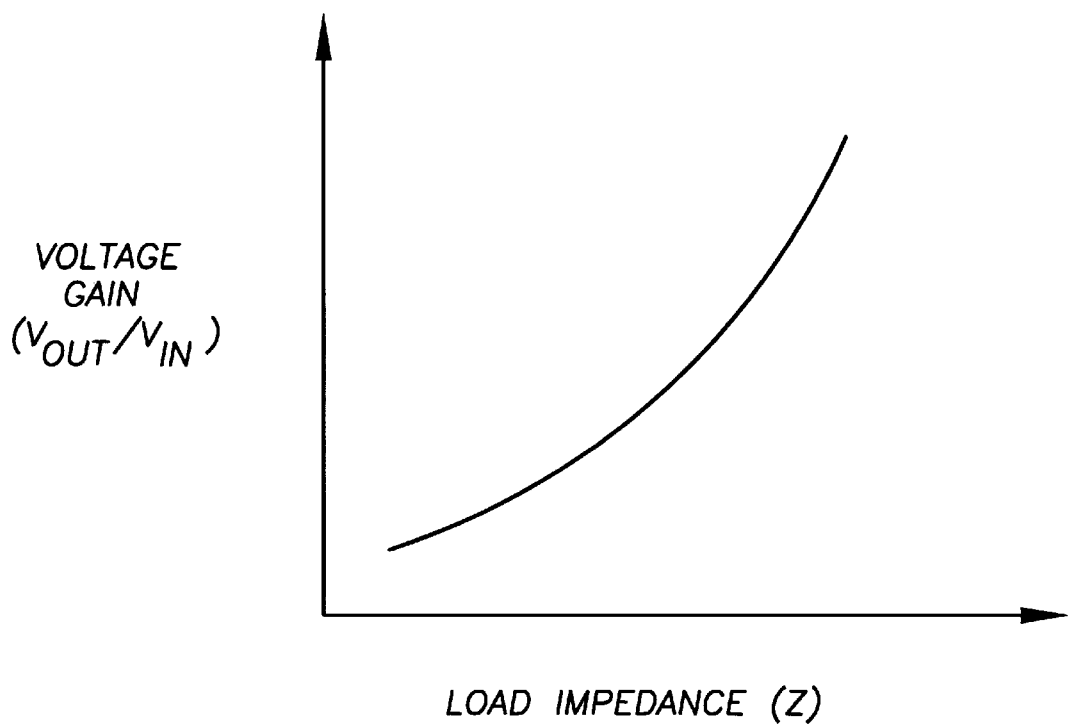
FIG. 8 is a graph plotting voltage gain versus load impedance of an exemplary multi-layer piezoelectric transformer that is preferably used in a voltage converter/ignition circuit constructed in accordance with the principles of the present invention.
Figure 9:
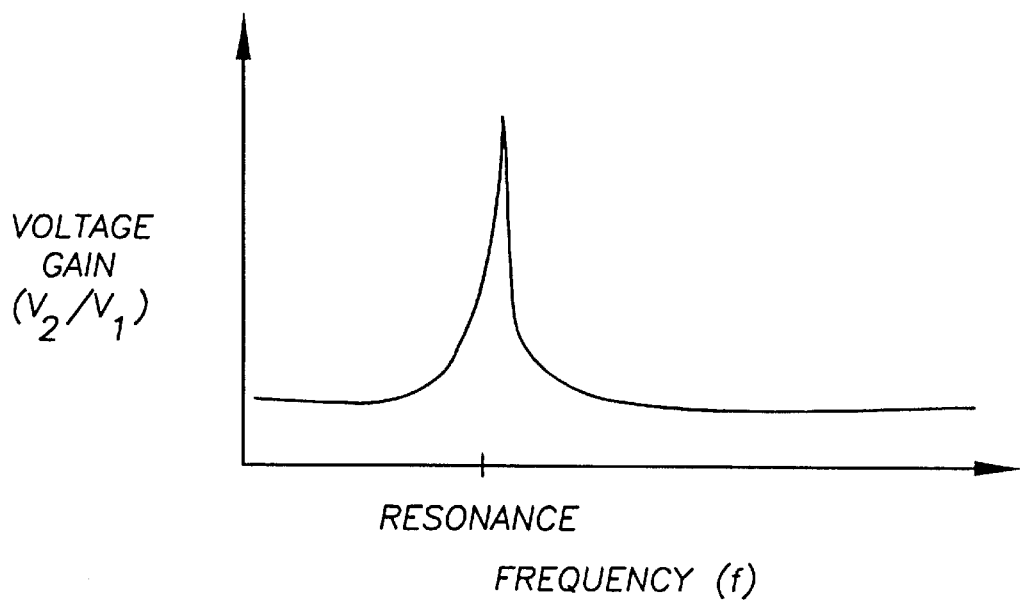
FIG. 9 is a graph plotting voltage gain versus frequency of an exemplary multi-layer piezoelectric transformer that is preferably used in a voltage converter/ignition circuit constructed in accordance with the principles of the present invention.

FIGS. 8–9 illustrate performance characteristics of the disclosed HDP transformer 1. FIG. 8 is a graph plotting voltage gain versus load impedance of an exemplary HDP transformer 1 used according to the principles of the present invention. As can be seen in FIG. 8, the voltage gain of the HDP transformer 1 increases with increasing load impedance. As used herein, "voltage gain" refers to the ratio of the voltage input (V1) across the electrodes of a first piezoelectric ceramic layer (e.g. ceramic layer 5) to the voltage output (V2) across the electrodes of a second ceramic layer (e.g. ceramic layer 11) of an HDP transformer. Thus it will be understood from a review of FIG. 8 that when the HDP transformer 1 is used in an electrical circuit in which a constant first voltage is applied across the electrodes of the first ceramic layer (e.g. ceramic layer 5) and a load of variable impedance is applied across the electrodes of the second ceramic layer (e.g. ceramic layer 11), the voltage developed across the electrodes of the transformer 1 will automatically increase as the impedance of the load increases, and will automatically decrease as the impedance of the load decreases.

FIG. 9 is a graph plotting voltage gain versus frequency (at constant load impedance) of an exemplary symmetric HDP piezoelectric transformer 1 used in the preferred embodiment of the present invention. As described above, in the preferred embodiment of the invention the HDP transformer 1 is a multi-layer composite structure having a generally right cylindrical shape. Accordingly, it will be understood that the preferred embodiment of the HDP transformer 1 is symmetrical in at least one dimension. For such a symmetric HDP transformer the maximum voltage gain occurs at the natural (resonant) frequency of the device; and, as illustrated in FIG. 9, such relatively high voltage gain is achieved over a relatively narrow bandwidth (as indicated by the steepness of the curve near resonant frequency).

Figure 10:
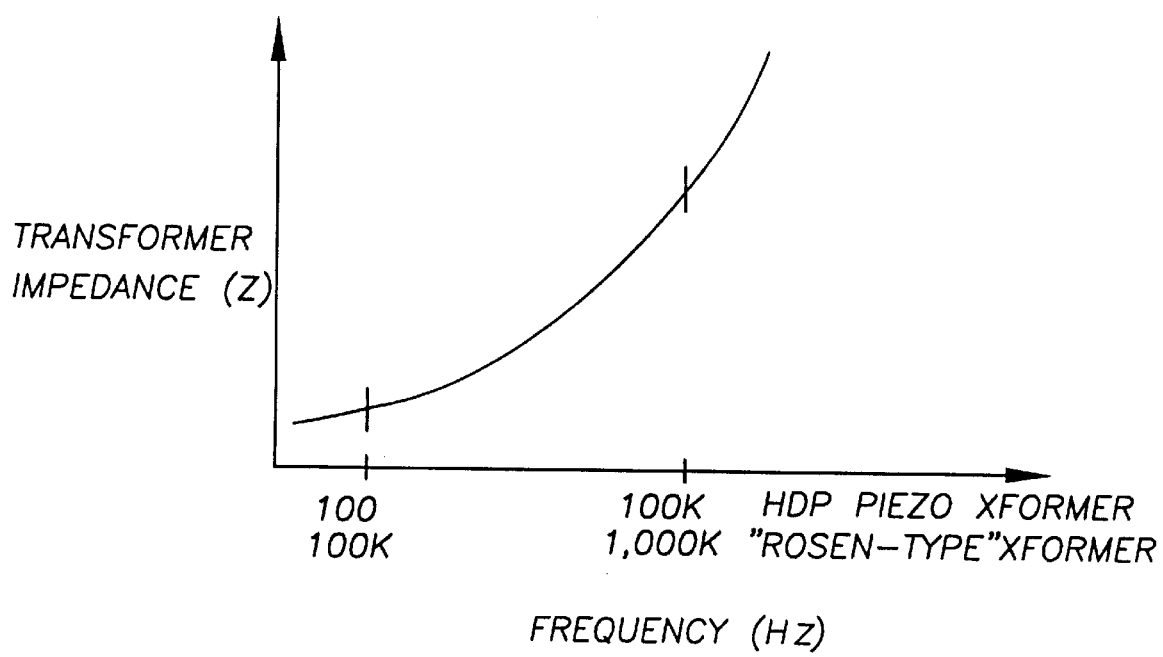
FIG. 10 is a graph comparing transformer impedance versus frequency of a typical prior Rosen-type transformer and an exemplary multi-layer piezoelectric transformer that is preferably used in a voltage converter/ignition circuit constructed in accordance with the principles of the present invention.
Figure 11:
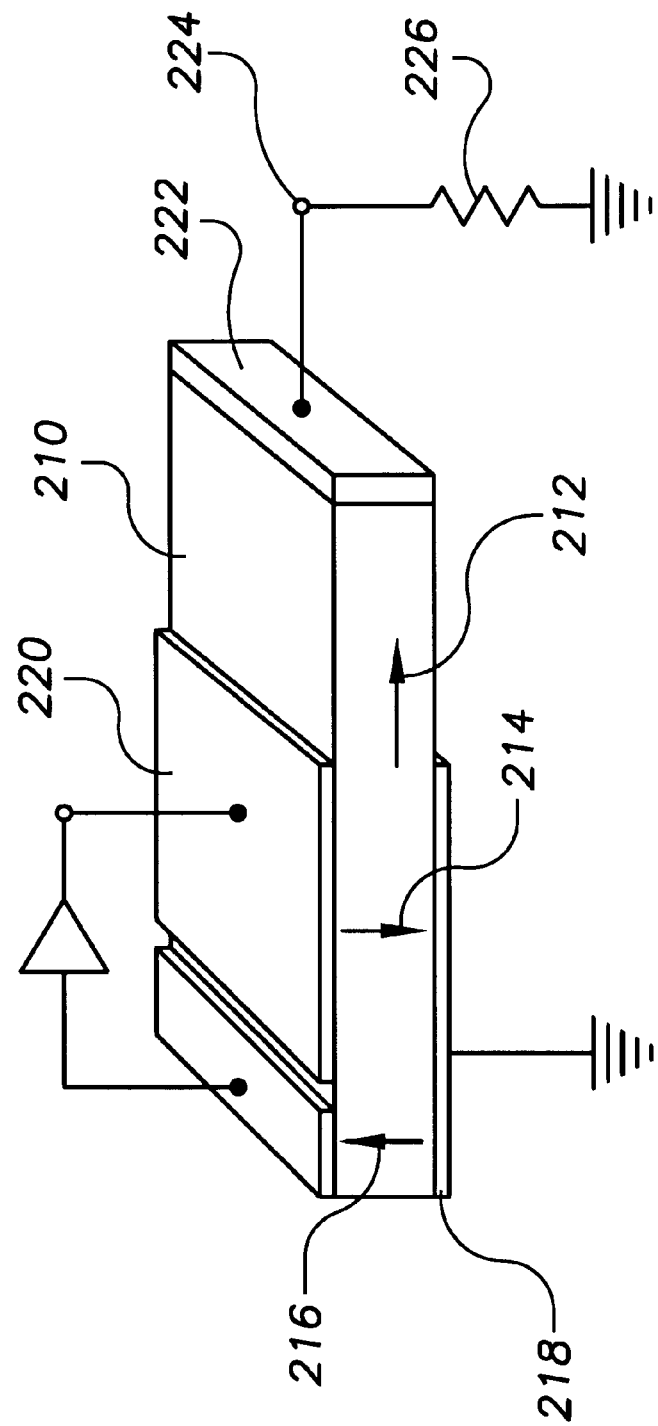
FIG. 11 is a perspective view showing a prior "Rosen-type" piezoelectric transformer.

FIG. 10 is a graph comparing internal transformer impedance versus input voltage frequency for an exemplary HDP piezoelectric transformer 1 used in the preferred embodiment of the present invention and a comparably-sized prior Rosen-type transformer. As illustrated in FIG. 10, the internal impedance of the typical HDP piezoelectric transformer (1), in the frequency range of 100 Hz to 100 kHz is much greater than that of prior Rosen-type transformers of comparable size. Accordingly, it will be understood that designing of circuitry using HDP transformer 1 can be simpler than designing of circuitry using prior Rosen-type transformers, because it is much easier to match (and maintain a match of) the impedance of the HDP transformer 1 than to match (and maintain a match of) the impedance of common prior Rosen-type transformers, which is more vulnerable to slight impedance variations.

DC-AC Voltage Converter Circuit

Figure 2:
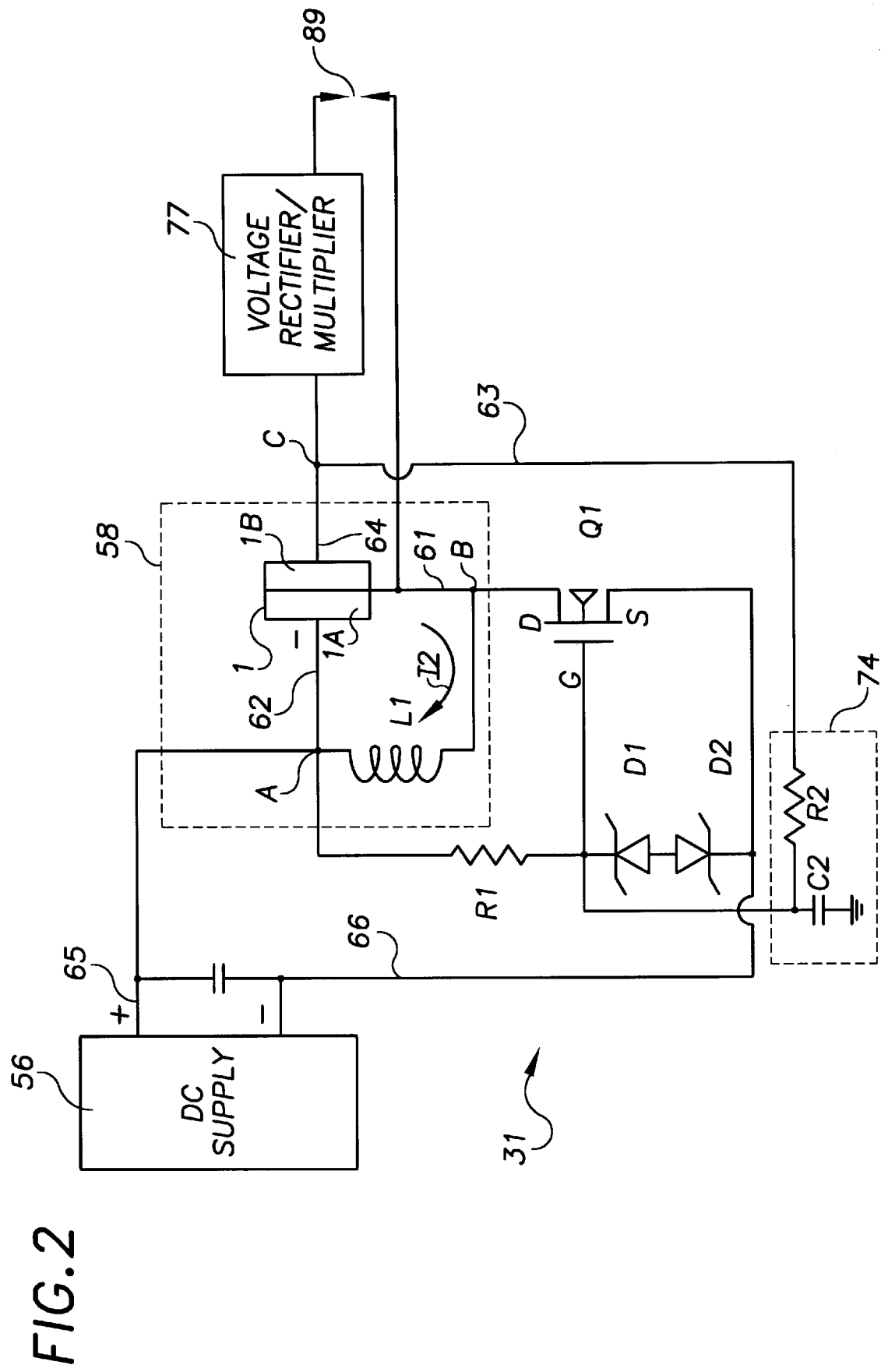
FIG. 2 a schematic diagram of the voltage converter/ignition circuit of FIG. 1, showing resonant circuit current flow in an opposite direction.

Referring now to FIGS. 1 and 2: FIG. 1 is a schematic diagram of one exemplary embodiment of a voltage converter circuit that incorporates principles of the present invention. In order to explain how a voltage converter circuit configured in accordance with the present invention may be used, FIG. 1 illustrates, and the following disclosure describes, an exemplary application of the present invention to the converter circuit wherein the "load" is a spark gap. However, as will be appreciated by those skilled in the art, a voltage converter circuit constructed in accordance with the present invention can be used in a wide range of applications and with a wide range of "loads".

It will be understood that the HDP transformer 1 that is referred to in the circuit illustrated in FIG. 1 and the corresponding Specification is preferably the HDP transformer 1 that is described in detail herein above and illustrated in FIGS. 3–10. However, as will become apparent to those of skill in the art, the principles of the present voltage converter circuit invention may be advantageously applied to other, conventional, piezoelectric transformers.

The preferred embodiment of the voltage converter circuit is generally indicated in FIG. 1 by the reference number 31. In the preferred embodiment of the invention, relatively low voltage electrical power is converted to a high frequency voltage, and then rectified to provide high DC voltage to a spark. In operation, the circuit 31 provides a high voltage potential across the spark gap 89 of a spark plug.

The circuit 31 is preferably powered by a DC power supply 56. The DC power supply may comprise one or more batteries. In the example illustrated in FIG. 1, the output from the DC supply 56 is preferably 12 volts. A capacitor C1 may be provided between the positive 65 and negative 66 output terminals of the DC supply 56.

The positive voltage output 65 from the DC supply 56 is connected (at junction A) to electrical conductor 62, which is connected to the input side 1A of the transformer 1. Resistor R1, which is in parallel with the input side 1A of the transformer, is connected in series between junction A and the gate (G) of FET Q1. When the circuit 31 is first turned on, the voltage of the gate (G) of FET Q1 is pulled up by resistor R1, which is of relatively high value, and this causes FET Q1 to turn on.

When FET Q1 is turned on, current begins to flow through the inductor L1, which is connected at one end to junction A and at the other end to junction B. At the same time, the voltage at junction B is pulled low. Junction B is also connected via conductor 61 to the center electrode (8) of the transformer and to the drain (D) of FET Q1.

With FET Q1 turned on, current begins to flow (from junction A towards junction B, as indicated by arrow I1) through inductor L1. The voltage at junction B thus being pulled low causes the input (primary) side 1A of the HDP transformer 1 to begin to charge. The charging of the input side 1A of the HDP transformer 1 causes the conductor 62 at the input side 1A of the HDP transformer to acquire a positive charge while and the conductor 61 to the center electrode (8) of the HDP transformer 1 is near ground. An electric field is thus established between the conductor 62 at the input side 1A of the transformer 1 and the conductor 61 at the center (i.e. "ground") electrode of the transformer.

The output side 1B of the HDP transformer provides an AC output voltage which is connected via conductor 64 to voltage rectifier 77 in order to convert the AC to a DC voltage. The high voltage DC output of the rectifier 77 is connected to the terminal of the spark plug. The ground side of the spark plug is connected via electrical conductor 61 to the center ("ground") electrode of the transformer, as illustrated in FIG. 1. Conductor 63, which is connected to conductor 64 at junction C, communicates the signal from the output side 1B of the transformer to the gate (G) of FET Q1.

The HDP transformer 1 is vibrated (by electrical excitation of the piezoelectric layer (5) on the "primary" side 1A of the transformer) in order to generate voltage at the "secondary" side 1B of the transformer. This voltage at the secondary side 1B of the transformer is sent to rectifier 77. Soon after energizing the circuit, (e.g., after the first 10 cycles), the voltage at the secondary side 1B of the transformer becomes high enough to create a spark across the spark gap. This may take a few micro-seconds, in order for the HDP transformer 1 to vibrate back and forth enough times for the amplitude of the vibrations (and, therefore, the voltage generated) to build up to a sufficiently high value to discharge across the spark gap.

As the HDP transformer 1 flexes (in response to, say, a positive first voltage potential between conductors 62 and 61 across the "driver" side 1A of the transformer) during one half cycle, it generates a negative second voltage between conductors 61 and 64 at the output (i.e. "driven") side 1B of the transformer. This voltage is fed back (via conductor 63) to the gate (G) of FET Q1 and, in turn, causes FET Q1 to turn off. When FET Q1 turns off, the magnetic field in inductor L1 begins to collapse. This (i.e. the collapse of the magnetic field) causes the current to continue flowing. The positive charge that has built up on the input side 1A of the HDP transformer 1, flows out of the HDP transformer 1, through the inductor L1 and into the "grounded" side of the inductor L1, as indicated in FIG. 1 by arrow I1.

As the magnetic field around inductor L1 continues to collapse, the HDP transformer 1 now flexes back in the opposite direction, and the HDP transformer 1 begins to accumulate negative charge at the input side 1A of the HDP transformer. Since the HDP transformer is now flexing in the opposite direction, FET Q1 will now turn on. When FET Q1 turns back on, a similar situation exists as before. The charge is taken out of the "ground" conductor 61 connected to the center electrode of the HDP transformer 1 and then current flow (indicated by arrow I2 in FIG. 2) increases in the inductor L1.

The described cycle keeps repeating so that, as the HDP transformer 1 output voltage changes polarity, the gate of FET Q1 turns on and off in synchronization with the tuning of the circuit. After a few cycles of operation, the voltage at the output 1B of the HDP transformer (and, therefore, the voltage in conductor 64) rises high enough to generate a spark across the spark gap 89.

In the circuit illustrated in FIG. 1, the output of a HDP transformer 1 is used to drive high frequency voltage to the spark gap via the AC-DC converter/rectifier 77. As will be discussed more fully below, the HDP transformer advantageously vibrates at or near its natural frequency, and in so doing produces an electrical signal of substantially constant high frequency, but at a voltage that automatically advantageously varies according to whether a spark has discharged across the spark gap 89. Also, as will discussed more fully below, the disclosed circuit permits the generation of higher transformer output voltage than would otherwise be possible, by recovering and advantageously applying otherwise unused energy that is temporarily stored during each half-cycle of operation.

As discussed above, the HDP transformer 1 converts electrical energy into mechanical energy; and the mechanical energy is then converted back into electrical energy. The magnitude of that mechanical energy determines, to some extent, the voltage gain of the device. Under "no-load" conditions the HDP transformer is typically capable of achieving more oscillatory motion (i.e. greater amplitude at a given frequency) than in "high-load" conditions. This is inherently so because when no charge is removed from the output (i.e. driven) side 1B of the transformer (as would typically occur if the output were not connected to a load) it is capable of moving more freely than it would if the charge were removed. Thus, when the transformer 1 oscillates freely it generates a greater voltage gain than when its movement is restricted. This greater voltage gain under no-load conditions is taken advantage of in the present circuit by the transformer's 1 automatically applying greater voltage to the load (i.e. to spark gap) when there is no load until a spark discharges across the spark gap. Prior to the spark gap's discharging, it presents no load to the HDP transformer 1. Under this condition, the voltage gain, and therefore the voltage output, of the HDP transformer 1 is relatively high. Since the voltage output of the HDP transformer 1 is high, the voltage initially applied to the spark gap is high.

Accordingly, it will be understood that the HDP transformer 1 provides a variable transformer output voltage that depends on the impedance of the load, such that the gain of the device is low for light loads and the gain of the device is high for high loads.

In prior (e.g. wire wound electromagnetic) transformers the transformer typically has a fixed output impedance and, for maximum power transfer, it is necessary to have a low impedance load matched to that output impedance. For such prior circuits, at any other (i.e. unmatched) impedance it is not possible to achieve maximum power transfer, and, accordingly, the efficiency decreases. In addition, in such prior transformers the voltage gain depends predominately on the ratio of the turns of the coils (a fixed number) and the frequency of the input signal.

Since an HDP transformer 1 constructed in accordance with the present invention has variable voltage gain and because the voltage gain changes with the load, there is a relatively wide range of load resistances at which it can achieve very high efficiency.

It will be understood from the above disclosure that HDP transformer 1 may be advantageously used in connection with an electrical circuit pursuant to the principles described herein above to provide an ignition circuit that can be made smaller and simpler than conventional circuits using magnetic step-up transformers or prior piezoelectric transformers. Significantly, such an electrical circuit may readily be constructed small enough to easily attach to a spark plug. This would eliminate the need for a secondary high voltage distribution system since the voltage could be stepped up immediately before the spark plug 89. Alternatively rather than by using a transformer circuit attached to each individual plug, a smaller coil and distributor circuit can be made as above using a conventional high voltage distribution system. The timing signal for firing the individual spark plugs may follow a mechanical input as from a mechanical cam in a distributor system. Alternatively, the timing signal can be electronic in response to onboard computer controlled ignition systems.

It will further be understood that in the above described application of the invention a DC first voltage (i.e. output from DC supply 54) is converted to an AC second voltage (i.e. at the output conductor 64 from transformer 1), wherein the second voltage (i.e. at the output conductor 64 from transformer 1) is higher than the first voltage (i.e. at the output from DC supply 54), and wherein the second voltage (i.e. at the output conductor 64 from transformer 1) is at a frequency corresponding to the natural (i.e. resonant) frequency of the transformer 1. Thus, the present invention provides an "inverter" circuit for efficiently converting a first (DC) voltage to a second (AC) voltage.

Since the frequency of the voltage at the output conductor 64 from transformer 1 depends only (or predominantly) upon the natural physical frequency of the transformer 1, the frequency of the second voltage (i.e., at the output conductor 64 from transformer 1) is substantially independent of the frequency of the first voltage (i.e., the output from the 60 Hz power supply 55). Furthermore, by advantageously selecting a transformer 1 having a very high natural (vibrational) frequency the output 64 from the transformer 1 can be chosen to be very high. It will be understood, then, that by rectifying (e.g., by diode array) and then filtering (e.g., by a capacitor element) the (high frequency) output 64 from the transformer 1, a modification of the disclosed circuit can also be used to convert a first DC voltage to a second DC voltage.

In addition, it will be understood from the above disclosure that an HDP transformer 1 constructed in accordance with the present invention may be used in conjunction with an electrical circuit pursuant to the principles described herein above to provide a ignition circuit which will generate a high-frequency, high-voltage, AC transformer output, which can be rectified and further multiplied before discharging across a spark gap.

As discussed above, the HDP transformer 1 that is used in the preferred embodiment of the invention is preferably circular in shape. The reason circular shape is preferred relates to the degrees of freedom of the device. A circular (or disc) shape HDP transformer has only a limited number of modes at which it can vibrate. By way of comparison, a square is not geometrically uniform about any point. A rectangle is even less uniform, and, therefore, can vibrate in several different modes. It will be appreciated then, that the power transmission capability of the HDP transformer depends on the efficiency by which it transfers mechanical (i.e. vibration) energy from one ceramic layer to the other. The more modes of vibration, the less efficiently that energy is transmitted.

The HDP transformer vibrates in either the fundamental mode of vibration or harmonics of same. Dissipation within the ceramic is directly related to the operation frequency. Therefore, when the frequency of vibration increases, heat generation and dissipation within the ceramic increases. So, if the device is operating at a harmonic (rather than the fundamental) mode, any part of the ceramic may be vibrating and the amount of power dissipation will be relatively higher.

Accordingly, in the preferred embodiment of the invention (wherein high power transmission efficiency is desirable) it is desirable that a symmetric (i.e. circular) HDP transformer be used. However, in certain other applications (for example in wide bandwidth signal transmission) wherein constancy of voltage gain over a wide signal input frequency range is desirable, it is preferable that the HDP transformer be asymmetrically shaped.

As discussed above, in the preferred embodiment of the invention the HDP transformer comprises a first ceramic disc and a second ceramic disc that are bonded together with an intermediate electrode 8 (preferably copper) layer therebetween. In the preferred method of manufacturing the HDP transformer the ceramic discs 5 and 11 have electro-deposited electrodes 4, 6, 10 and 12 on their major planar faces. In addition, supplemental copper electrodes 2 and 14 are bonded to the opposite outboard planar surfaces of the bonded ceramic layers. The supplemental electrode layers 2 and 14 provide good mechanical and electrical connection between the wire leads and the electro-deposited electrodes 4 and 12. However, it is within the scope of the invention to provide a modification of the HDP transformer that is manufactured without one or more of the supplemental electrodes 2 and 14. In addition, the supplemental electrodes 2 and 4 and the intermediate electrode 8 can be made of conductive materials other than copper.

In the preferred embodiment of the invention the various described layers are bonded together with "Cibageigy AV118" epoxy. During manufacture of the HDP transformer 1 the composite layers of the transformer are clamped together and heated to a temperature of at least 121 degrees C., which is the activation temperature of the epoxy. In order to accelerate the curing process the temperature may be advantageously raised to 150–175 degrees C., well below the Curie temperature of the ceramic layers of the device. The "Cibageigy AV118" epoxy is preferred because it provides a strong bond between the layers of the HDP transformer and can be cured at a temperature below the curie temperature of the ceramic layers. However, other methods of bonding the various layers (i.e. the ceramic and electrode layers) of the device together may be used, including other epoxies (both conductive and nonconductive), ultrasonic welding, polyimide adhesives and cofiring.

In the preferred embodiment of the HDP transformer the ceramic layers are made of a very hard piezoelectric ceramic material, for example ceramic #841 as manufactured and sold commercially by American Piezo Ceramics, Inc. of Mackeyville, Pa. The ceramic material preferably has a high deflection per volt, a high curing temperature, does not "depole" very easily, and is hard. A material having these attributes will typically have a high "Q" rating (i.e. the power per cycle in the device divided by the power per cycle that is needed maintain the device at that power level must be high). The Q-rating of the ceramic used in the preferred embodiment of the invention is 1400.

In the circuits described herein above, the HDP transformer is between ½" and 1" diameter and resonates at a frequency between 85 and 150 kHz. By way of example, a ¾" diameter HDP transformer constructed in accordance with the present invention nominally operates (i.e. resonates) at a frequency of 125 kHz. The operating frequency of the HDP transformer depends, in part, on the relationship between the thicknesses of the ceramic layers 5 and 11 on the input and output sides, respectively, of the transformer. In the preferred embodiment of the invention, the thickness of the ceramic layer 5 on the input side of the transformer is in the range of 0.030 to 0.100 inches; and the thickness of the ceramic layer 11 on the output side of the transformer is in the range of 0.090 to 0.100 inches. If the output-side ceramic (11) is too thin then the voltage gain will be too low for use in the preferred circuit application. Generally, the input-ceramic (5) thickness is preferably somewhat thinner than the thickness of the output ceramic layer (11), which condition provides a better wave form (as described above) and less energy dissipation within the ceramic layers themselves.

Back-to-back zener diodes D1 and D2 are located between the gate (G) and source (S) of FET Q1, as illustrated in FIGS. 1 and 2 to clamp the voltage at the gate of the FET.

An R-C phase adjustment sub-circuit 64, comprising circuit components resistor R2 and capacitor C2, may be advantageously inserted into the feedback line (conductor 63), as illustrated in FIGS. 1 and 2 in order to optimize the efficiency of the voltage converter circuit. The HDP transformer 1 output signal (conductor 64) normally lags the input driving signal (conductor 62) by 90 degrees at resonance. The input side 1A of HDP transformer 1 has a real capacitance. At resonance it also has a large imaginary (i.e. "mechanical") capacitance and inductance (corresponding to the mechanical inertia of the flexing transformer). These are also present in the output side 1B of the HDP transformer 1. There exists a lag in the signal from the input side 1A to the output 1B side of the transformer. This lag may be adjusted up to 90 degrees according to the values of the R-C phase adjustment components (R2 and C2) selected.

It will be understood that the gate (G) of FET Q1 is responsive to voltage rather than current. Thus, the polarity of the HDP transformer 1 output may be advantageously oriented, using proper phase adjustment 64 in the feedback circuitry (i.e. conductor 63), to cause FET Q1 to switch when the voltage at the gate (G) to FET Q1 is at (or nearly at) zero. In this manner (i.e. by switching FET Q1 at the zero voltage point), very high operational efficiency can be achieved, since the power dissipated by FET Q1 is zero when the voltage is zero.

It will be understood that a parallel resonant circuit 58 is established wherein opposite ends of inductor L1 are electrically connected to the electrodes opposite opposing faces of the piezoelectric layer (5) of the driver side 1A of the transformer. In accordance with operation of the preferred embodiment of the invention, during one half-cycle of operation voltage of a first polarity is applied across the opposing electroded faces of the driver-side piezoelectric layer, which causes it to deform in a first direction. This deformation causes the second piezoelectric layer (11) to correspondingly deform. A finite amount of electrical energy is required to cause this deformation of the composite HDP transformer structure. The described deformation of the second piezoelectric layer (11) results in the piezoelectric generation of electrical energy (in the form of a voltage potential between the electrodes of the piezoelectric layer (11)) at the driven side 1B of the transformer. The electrical energy generated at the driven side 1B of the transformer can be advantageously rectified and applied to a load (such as the spark gap 89 in the example described above).

The electrical energy generated at the driven side 1B of the transformer ("output electrical energy") is inherently less than the amount of electrical energy that is initially applied to the driver side 1A of the transformer ("input electrical energy") in order to cause the described deformation. As will be appreciated by those skilled in the art, in prior voltage converter circuits comprising piezoelectric transformers, the difference between the magnitude of the output electrical energy and the input electrical energy was an approximate (albeit low) measure of the inefficiency of such transformer circuits because, in such prior circuits, the differential energy was largely (and in some cases totally) lost (i.e. dissipated as heat from the transformer). In a voltage converter circuit constructed and operated in accordance with the present invention, a portion of the input electrical energy is stored as piezoelectrically generated electrical potential energy (i.e. as a voltage charge) at the electrodes of the driver side piezoelectric layer 5 and a portion of the input electrical energy is stored as mechanical potential energy (i.e. by flexure of the composite structure within its elastic limit)—in addition to the portion of the input energy that converted to output electrical energy at the driven side 1B of the transformer. As the (composite structure of the) transformer flexes in the opposite direction during the second half-cycle of operation, the stored potential energy is converted to kinetic (electrical) energy in the form of current flowing in the opposite direction from the driver side 1A through the parallel resonant circuit 58. Inductor L1 alternately stores and releases electrical energy in coordination with the flexing of the transformer. The energy released from inductor L1 is advantageously used to supplement current from DC supply 56 to provide input electrical energy to drive transformer 1. It will therefore be understood that, in the above described manner, the amount of electrical energy from DC supply 56 that is required to produce a given amount of useable output electrical energy at the driven side 1B of the transformer is reduced relative to prior voltage converter circuits.

Isolated Converter Circuit Modification

Figure 12:
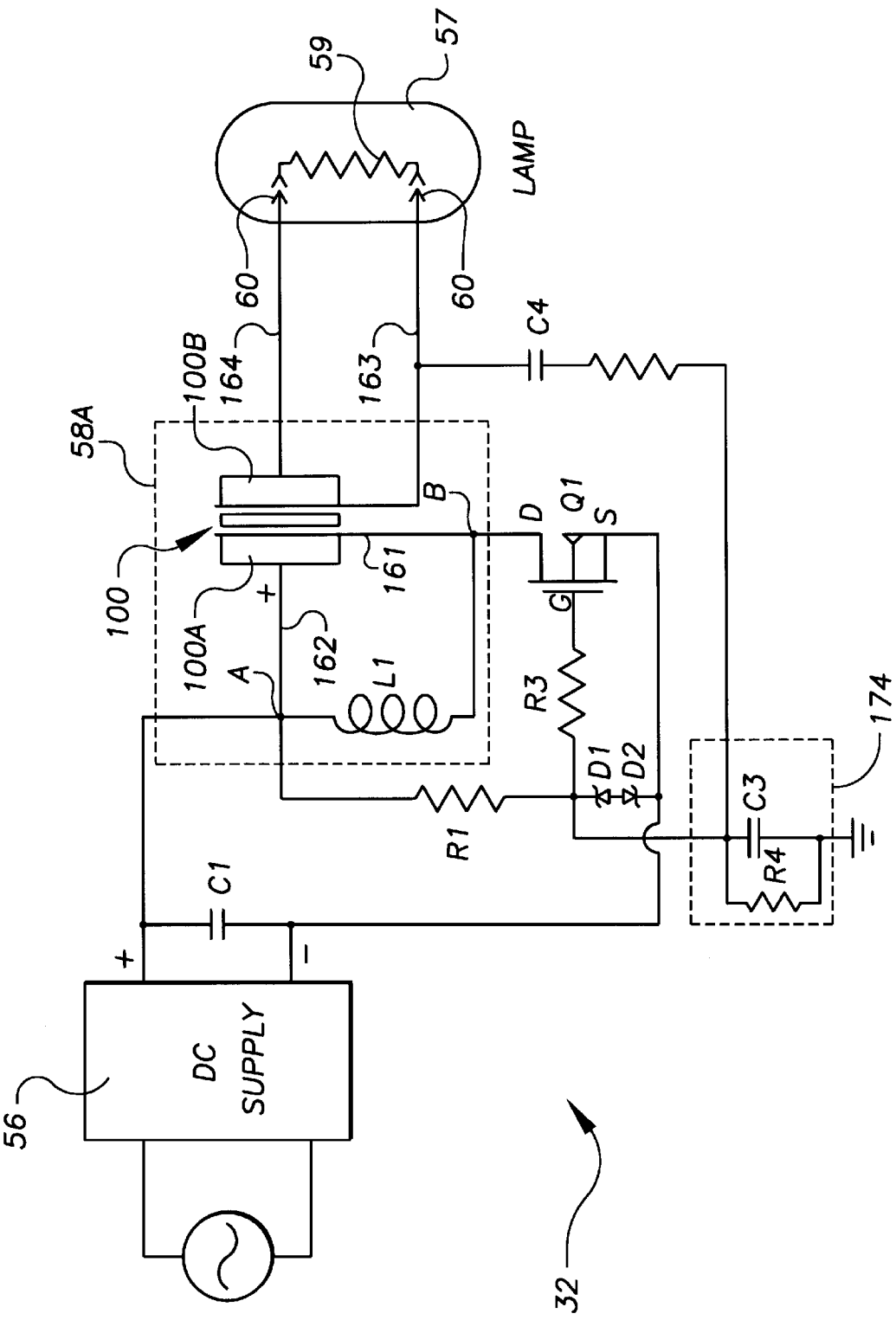
FIG. 12 a schematic diagram of a modified embodiment of a voltage converter/ignition circuit driving an HID lamp that incorporates principles of the present invention.
Figure 13:
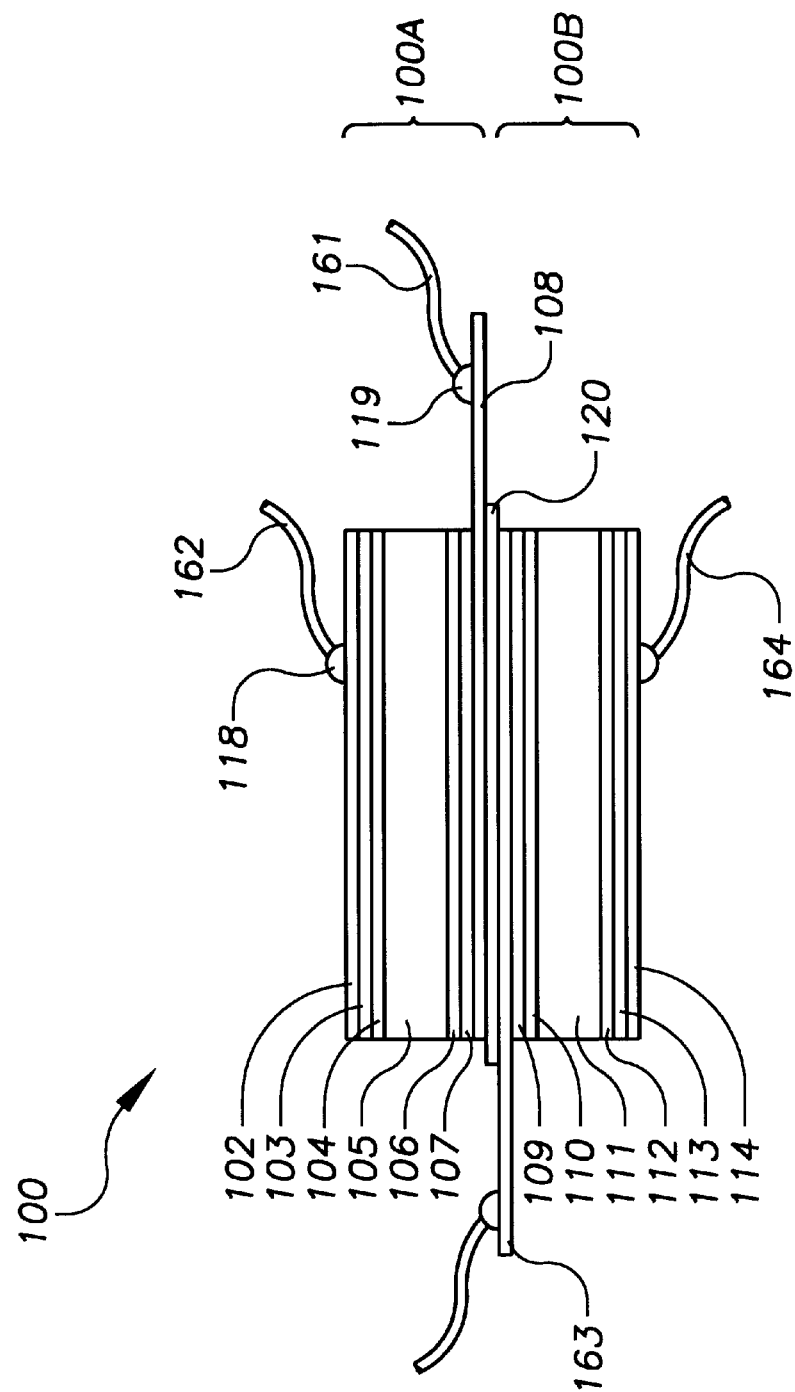
FIG. 13 is an elevation view showing a modified multi-layer piezoelectric transformer that may be used in the voltage converter/ignition circuit shown in FIG. 12; and, FIG. 14 a schematic diagram of a modified embodiment of a voltage converter/ignition circuit that incorporates principles of the present invention.

Referring now to FIGS. 12–13: FIG. 13 illustrates an isolating HDP transformer 100 whose operation is substantially identical to that of the HDP transformers 1 and 1C (FIGS. 3–5 and FIG. 7, respectively), except that the driver side 100A of the device is electrically isolated from the driven side 100B of the device by an electrical insulator layer 120. The driver side 100A of the isolating HDP transformer 100 illustrated in FIG. 13 comprises a first metal layer 102 bonded by adhesive 103 to the electrode 104 on one face of a piezo-ceramic layer 105; and a second metal layer 108 bonded by adhesive 107 to the electrode 106 on the other face of the piezo-ceramic layer 105. The driven side 100B of the isolating HDP transformer 100 illustrated in FIG. 13 comprises a first metal layer 114 bonded by adhesive 113 to the electrode 112 on one face of a piezo-ceramic layer 111; and a second metal layer 163 bonded by adhesive 109 to the electrode 110 on the other face of the piezo-ceramic layer 111. The driver side 100A and the driven side 100B of the HDP transformer 100 are bonded together with insulator layer 120 disposed therebetween, as illustrated in FIG. 13. The two sides (100A and 100B) of the transformer 100 may be bonded to the insulator layer 120 by adhesive, ultrasonic welding, or other method.

A voltage converter circuit 32 that incorporates an isolating HDP transformer 100 is illustrated in FIG. 12. The voltage converter circuit 32 illustrated in FIG. 12 works in much the same fashion as the (non-isolating) voltage converter circuit 31 described above and illustrated in FIG. 1. However, in the isolating voltage converter circuit 2A, inductor L1, which is connected via conductors 161 and 162 in parallel to the driver side 100A of the transformer, is isolated from the spark gap 89, which is connected to the driven side 100B of the transformer by conductors 163 and 164 and rectifier 88. Capacitor C4 may be disposed between the driven side 100B side of the transformer and the gate (G) of FET Q1 in order to provide additional electrical isolation between the voltage supply 56 and the load (i.e. spark gap 89).

Modified Voltage Converter Circuit With Oscillator Sub-Circuit

Figure 14:
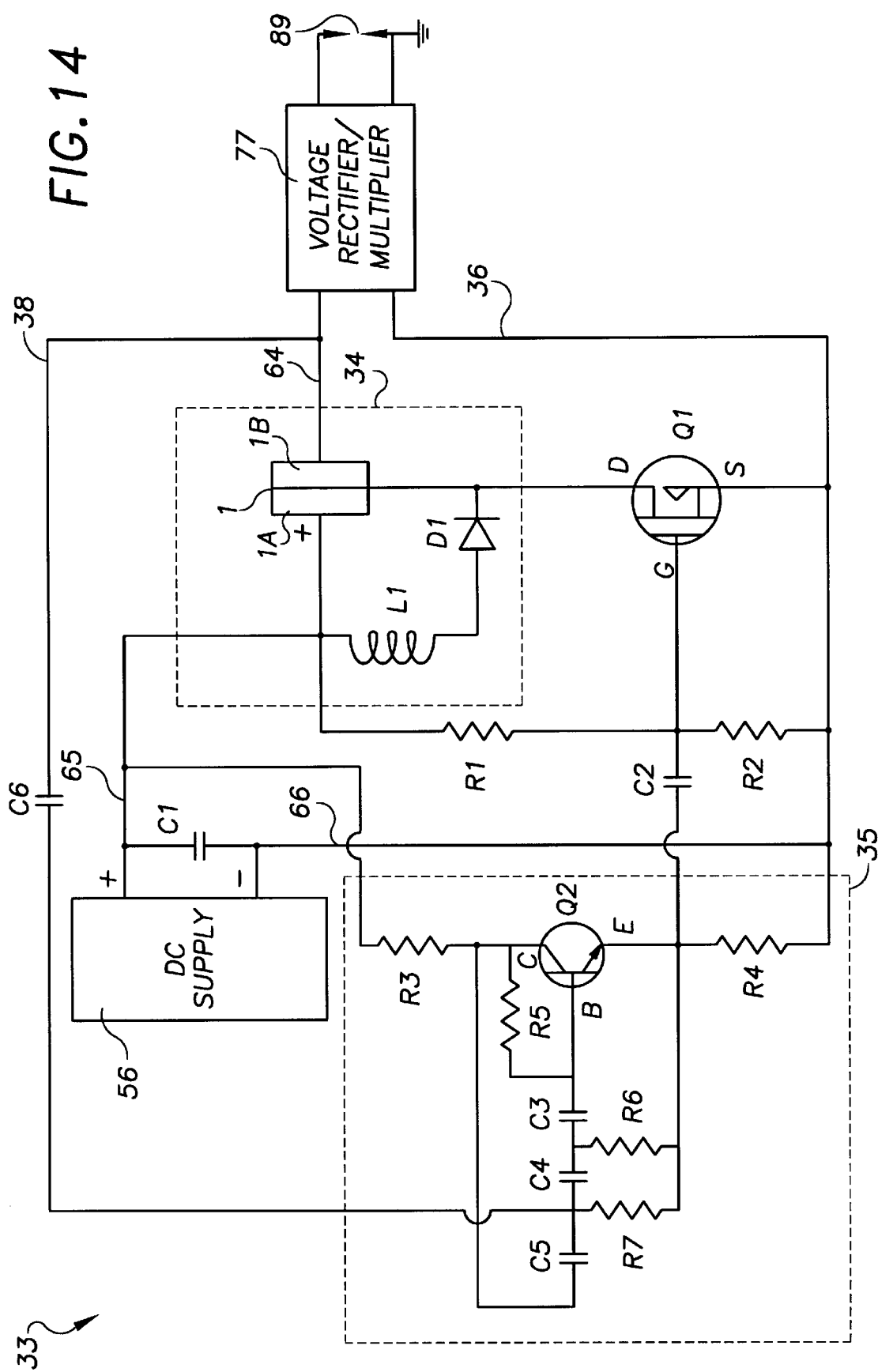

Referring now to FIG. 14: FIG. 14 illustrates a second modified voltage converter circuit 33 constructed and operated in accordance with the principles of the present invention. As with the above described preferred embodiment (illustrated in FIG. 1) and the above described first modified embodiment (illustrated in FIG. 12), circuitry is provided wherein a DC signal is applied to a resonating HDP transformer 1 to produce an AC signal at the output from the transformer.

In the above described exemplary applications of the invention (e.g. FIGS. 1 and 12) the AC signal at the output from the transformer is rectified to a DC signal and used to create an electrical discharge across a spark gap 89. In the previously described embodiments of the invention (specifically circuits 31 and 32) a parallel resonant sub-circuit (58 or 58A) is provided between opposing electrodes of the input (i.e. driver) side of the HDP transformer; and feedback from the output side of the transformer is communicated to the gate (G) of switching transistor Q1 (via conductor 63).

In the second modified voltage converter circuit 33, a series resonant sub-circuit 34 (comprising inductor L1 in series with diode D1) is provided between opposing electrodes of the input (i.e. driver) side 1A of the HDP transformer; and feedback from the low voltage side of the load (i.e. spark gap 89) is communicated to the gate of switching transistor Q1 (via conductor 36). In addition, in the second modified voltage converter circuit 33, a phase shift oscillator sub-circuit 35 provides a pulsed signal to the gate (G) of the switching transistor Q1.

It will be understood that the previously described preferred embodiment of the invention (illustrated in FIG. 1) and the previously described first modification of the invention (illustrated in FIG. 12) are "self resonating" circuits. The previously described "self resonating" circuits 31 and 32 largely rely on the initial pulse from turning on the DC power supply (for example by closing an on-off switch, not shown) to cause the transformer to begin resonating. Once the transformer begins resonating, the circuit operates as described above.

The second modified voltage converter circuit 33 is not a "self resonating" circuit; instead it has a phase shift oscillator sub-circuit 35 that provides small pulse signals to the gate (G) of the switching transistor Q1. The phase shift oscillator sub-circuit 35 generates small pulses that start the transformer 1 resonating when the circuit is initially turned on. The oscillator sub-circuit 35 preferably comprises three bypass capacitors C3, C4 and C5. Opposite ends of bypass capacitor C4 are connected to bypass capacitors C5 and C3. The opposite end of bypass capacitor C3 is connected to the base of phase shift transistor Q2. Biasing resistor R5 is connected between the base and collector of the phase shift transistor Q2. During the first several cycles of operation, the phase shift oscillator sub-circuit 35 provides small pulsed signals of sufficient voltage to turn FET Q1 off and on. After the circuit has operated for several cycles, the spring action of the transformer is sufficient to cause the parallel resonant circuit 34 to begin operating. When the parallel resonant circuit 34 is operating, energy required to flex the transformer 1 back and forth is alternately stored and released by the inductor L1 (i.e. in its magnetic field) and by the transformer itself (i.e. as mechanical spring energy), such that the amount of "new" energy that is provided during each cycle by the DC supply 56 to the input side 1A of transformer 1 is nearly equal to the energy drawn from the output side 1B of the transformer 1 by the load (i.e. spark gap 89).

Feedback is provided (via conductor 38 and parallel capacitor C6) from the output side output of transformer 1 to the phase shift oscillator 35, as illustrated in FIG. 14. During normal steady state operation of the second modified voltage converter circuit 33, the parallel resonant circuit 34 is maintained in tuned resonant operation by the phase shift sub-circuit 35 and R-C components capacitor C2 and resistor R2, which control the sequencing of opening and closing the gate (G) of FET Q1.

Accordingly, the scope of the invention should be determined not by the embodiment illustrated, but by the appended claims and their legal equivalents.

What is claimed is:

1. A spark discharge circuit, comprising:
   a resonant sub-circuit;
      said resonant sub-circuit comprising a transformer device;
         said transformer device having an input portion and output portion;
         said input portion comprising an electroactive layer disposed between a first electrode layer and a second electrode layer;
         and said output portion comprising a third electrode layer adjacent an electroactive layer;
      said resonant sub-circuit further comprising an inductor electrically connected in parallel with said input portion of said transformer device between said first electrode layer and said second electrode layer;
   a first conductor adapted to be connected to a DC first voltage;
      said first conductor being electrically connected to said first electrode layer and to a first end of said inductor;
   a second conductor adapted to be connected to a DC second voltage, said DC first voltage being greater than said DC second voltage;
   a switching device (Q1);
      said switching device having a control input conductor (G), a first switch terminal (D) and a second switch terminal (S);
      said first switch terminal (D) being electrically connected to said second electrode layer;
      said second switch terminal (S) being electrically connected to said second conductor;
   a first resistor electrically connected in parallel with said inductor;
      said first resistor being electrically connected at a first end to said inductor and said first conductor and said first electrode;
      and said first resistor being electrically connected at a second end to said control input conductor (G) of said switching device (Q1);
   a second resistor electrically connected in parallel with said switching device (Q1);
      said second resistor being electrically connected at a first end to said control input conductor (G) of said switching device (Q1);
      and said second resistor being electrically connected at a second end to said second terminal (S) of said switching device (Q1);
   a first output conductor electrically connected to said third electrode;
      wherein a DC voltage potential applied between said first conductor and said second conductor
         may be converted to an AC voltage potential between said first output conductor and first switch terminal (D);
   a voltage rectifier for converting said AC voltage into a third DC voltage;
      an input to said rectifier being said AC voltage potential between said first output conductor and said first terminal (D) of said switching device (Q1);
      an output of said rectifier being a third DC voltage potential between a first and a second output terminal of said voltage rectifier;
   a third conductor with first and second ends;
      said first end of said third conductor being electrically connected to said first output terminal of said voltage rectifier; and
   a fourth conductor with first and second ends;
      said first end of said fourth conductor being electrically connected to said second output terminal of said voltage rectifier;
      said second end of said third conductor and said second end of said fourth conductor defining a spark gap;
   whereby said third DC voltage potential between said first and second output terminals of said voltage rectifier is sufficient to generate a spark across said spark gap.

2. A spark discharge circuit, comprising:
   a resonant sub-circuit;
      said resonant sub-circuit comprising a transformer device;
         said transformer device having an input portion and output portion;
         said input portion comprising an electroactive layer disposed between a first electrode layer and a second electrode layer;
         and said output portion comprising a third electrode layer adjacent an electroactive layer;
      said resonant sub-circuit further comprising an inductor electrically connected in parallel with said input portion of said transformer device between said first electrode layer and said second electrode layer;
   a first conductor adapted to be connected to a DC first voltage;
      said first conductor being electrically connected to said first electrode layer and to a first end of said inductor;
   a second conductor adapted to be connected to a DC second voltage, said DC first voltage being greater than said DC second voltage;
   a switching device (Q1),
      said switching device having a control input conductor (G), a first switch terminal (D) and a second switch terminal (S);
      said first switch terminal (D) being electrically connected to said second electrode layer;
      said second switch terminal (S) being electrically connected to said second conductor;
   a first resistor electrically connected in parallel with said inductor;
      said first resistor being electrically connected at a first end to said inductor and said first conductor and said first electrode;
      and said first resistor being electrically connected at a second end to said control input conductor (G) of said switching device (Q1);

a first output conductor electrically connected to said third electrode layer;

a second resistor electrically connected in parallel with said switching device (Q1) and said output portion of said transformer device;

said second resistor being electrically connected at a first end to said control input conductor (G) of said switching device (Q1), and said second resistor being electrically connected at a second end to said third electrode layer;

wherein a DC voltage potential applied between said first conductor and said second conductor may be converted to an AC voltage potential between said first output conductor and second resistor;

a voltage rectifier for converting said AC voltage into a third DC voltage;

an input to said rectifier being said AC voltage potential between said first output conductor and said second resistor;

an output of said rectifier being a third DC voltage potential between a first output terminal of said voltage rectifier and said second electrode layer;

a second output conductor with first and second ends;

said first end of said second output conductor being electrically connected to said second electrode layer;

a third conductor with first and second ends;

said first end of said third conductor being electrically connected to said first output terminal of said voltage rectifier; and said second end of said second output conductor and said second end of said third conductor defining a spark gap;

whereby said third DC voltage potential between said first output terminal of said voltage rectifier and said second electrode layer is sufficient to generate a spark across said spark gap.

3. A spark discharge circuit, comprising:

a resonant sub-circuit;

said resonant sub-circuit comprising a transformer device;

said transformer device having an input portion, an output portion and an isolation layer;

said input portion comprising a first electroactive layer disposed between a first electrode layer and a second electrode layer;

said output portion comprising a second electroactive layer disposed between a third electrode layer and a fourth electrode layer;

and said isolation layer comprising a dielectric layer disposed between said second electrode layer and said third electrode layer said resonant sub-circuit further comprising an inductor electrically connected in parallel with said input portion of said transformer device between said first electrode layer and said second electrode layer;

a first conductor adapted to be connected to a DC first voltage;

said first conductor being electrically connected to said first electrode layer and to a first end of said inductor;

a second conductor adapted to be connected to a DC second voltage, said DC first voltage being greater than said DC second voltage;

a switching device (Q1), said switching device having a control input conductor (G), a first switch terminal (D) and a second switch terminal (S);

said first switch terminal (D) being electrically connected to said second electrode layer;

said second switch terminal (S) being electrically connected to said second conductor;

a first resistor electrically connected in parallel with said inductor;

said first resistor being electrically connected at a first end to said inductor and said first conductor and said first electrode;

and said first resistor being electrically connected at a second end to said control input conductor (G) of said switching device (Q1);

a first output conductor electrically connected to said fourth electrode layer;

a second output conductor electrically connected to said third electrode layer;

a second resistor electrically connected in parallel with said switching device (Q1) and said output portion of said transformer device;

said second resistor being electrically connected at a first end to said control input conductor (G) of said switching device (Q1);

and said second resistor being electrically connected at a second end to said third electrode layer;

wherein a DC voltage potential applied between said first conductor and said second conductor may be converted to an AC voltage potential between said first output conductor and second resistor;

a voltage rectifier for converting said AC voltage into a third DC voltage;

an input to said rectifier being said AC voltage potential between said first output conductor and said second resistor;

an output of said rectifier being a third DC voltage potential between a first and a second output terminal of said voltage rectifier;

a third conductor with first and second ends;

said first end of said third conductor being electrically connected to said first output terminal of said voltage rectifier; and a fourth conductor with first and second ends;

said first end of said fourth conductor being electrically connected to said second output terminal of said voltage rectifier;

said second end of said third conductor and said second end of said fourth conductor defining a spark gap;

whereby said third DC voltage potential between said first and second output terminals of said voltage rectifier is sufficient to generate a spark across said spark gap.

* * * * *